US012642107B2

(12) United States Patent
Otsuka

(10) Patent No.: US 12,642,107 B2
(45) Date of Patent: May 26, 2026

(54) SEMICONDUCTOR DEVICE

(71) Applicant: ROHM CO., LTD., Kyoto (JP)

(72) Inventor: Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 457 days.

(21) Appl. No.: 18/251,678

(22) PCT Filed: Oct. 27, 2021

(86) PCT No.: PCT/JP2021/039593
§ 371 (c)(1),
(2) Date: May 3, 2023

(87) PCT Pub. No.: WO2022/113617
PCT Pub. Date: Jun. 2, 2022

(65) Prior Publication Data
US 2023/0411338 A1 Dec. 21, 2023

(30) Foreign Application Priority Data
Nov. 27, 2020 (JP) ................................. 2020-196553

(51) Int. Cl.
*H10W 70/40* (2026.01)
*H10W 72/00* (2026.01)
(Continued)

(52) U.S. Cl.
CPC .... *H10W 70/481* (2026.01); *H10W 72/07655* (2026.01); *H10W 72/352* (2026.01);
(Continued)

(58) Field of Classification Search
CPC ................. H01L 23/3107; H01L 24/29; H01L 23/49562; H01L 24/40; H01L 23/49524;
(Continued)

(56) References Cited

U.S. PATENT DOCUMENTS

2014/0138710 A1* 5/2014 Ohtsu .................... H01L 24/89
257/77
2017/0179074 A1* 6/2017 Anderson ............... H01L 24/85
(Continued)

FOREIGN PATENT DOCUMENTS

DE 10 2017 200 256 A1 8/2017
EP 2 963 682 A1 1/2016
(Continued)

OTHER PUBLICATIONS

Office Action issued in corresponding Japanese Patent application No. 2022-565138, Jun. 10, 2025, and machine translation (8 pages).
(Continued)

*Primary Examiner* — Mouloucoulaye Inoussa
(74) *Attorney, Agent, or Firm* — HSML P.C.

(57) ABSTRACT

A semiconductor device according to the present disclosure includes a first semiconductor element; a first connecting member; and a first member. The first semiconductor element has a first element obverse surface and a first element reverse surface that face mutually opposite in a thickness direction. The first semiconductor element also has a first electrode disposed on the first element obverse surface. The first connecting member is electrically connected to the first electrode. The first member overlaps with the first electrode as viewed in the thickness direction, has a Vickers hardness lower than a Vickers hardness of the first connecting member, and has electroconductivity.

15 Claims, 27 Drawing Sheets

(51) Int. Cl.

| | |
|---|---|
| *H10W 72/30* | (2026.01) |
| *H10W 72/60* | (2026.01) |
| *H10W 90/00* | (2026.01) |

(52) U.S. Cl.

CPC ........ *H10W 72/646* (2026.01); *H10W 72/886* (2026.01); *H10W 90/736* (2026.01); *H10W 90/767* (2026.01)

(58) Field of Classification Search

CPC .............. H01L 24/73; H01L 23/49575; H01L 23/49541; H01L 24/34; H01L 24/85; H01L 24/45; H01L 24/03; H01L 24/05; H01L 24/06; H01L 24/48; H01L 23/36; H01L 24/49; H01L 21/31111; H01L 24/08; H01L 23/49503; H01L 24/83; H01L 24/92; H01L 24/32; H01L 24/43; H01L 2224/48465; H01L 2224/29139; H01L 2924/19107; H01L 2224/73263; H01L 2224/0603; H01L 2224/48247; H01L 2224/73221; H01L 2224/48227; H01L 2224/06181; H01L 2224/40245; H01L 2224/48491; H01L 2224/40505; H01L 2224/04042; H01L 2224/4911; H01L 2224/03614; H01L 2224/05671; H01L 2224/05186; H01L 2224/05655; H01L 2224/85; H01L 2224/05012; H01L 2224/05558; H01L 2224/45147; H01L 2224/05017; H01L 2224/45124; H01L 2224/48458; H01L 2224/05557; H01L 2224/05005; H01L 2224/0508; H01L 2224/45139; H01L 2924/12032; H01L 2224/03464; H01L 2924/13091; H01L 2224/05013; H01L 2224/05015; H01L 2224/05556; H01L 2924/2064; H02M 7/53871

See application file for complete search history.

(56) References Cited

U.S. PATENT DOCUMENTS

| | | | |
|---|---|---|---|
| 2017/0200691 A1 | 7/2017 | Fujino et al. | |
| 2018/0012826 A1* | 1/2018 | Saito | H01L 21/561 |
| 2018/0053737 A1* | 2/2018 | Ogawa | H01L 24/03 |
| 2018/0211930 A1* | 7/2018 | Take | H01L 24/05 |
| 2018/0308814 A1* | 10/2018 | Take | H01L 24/05 |
| 2019/0355633 A1 | 11/2019 | Liu et al. | |
| 2021/0273394 A1* | 9/2021 | Nakamura | H01R 43/02 |
| 2021/0305174 A1* | 9/2021 | Nishii | H01L 23/562 |
| 2024/0243041 A1* | 7/2024 | Yanagimoto | H01L 23/043 |

FOREIGN PATENT DOCUMENTS

| | | |
|---|---|---|
| JP | 2014-017417 | 1/2014 |
| JP | 2018-504788 | 2/2018 |
| JP | 2018-107269 | 7/2018 |
| WO | 2012/053131 A1 | 4/2012 |

OTHER PUBLICATIONS

International Search Report issued in International Application No. PCT/JP2021/039593, Dec. 28, 2021, 2 pages.

Office Action received in the corresponding German Patent application, Jan. 17, 2024, and machine translation (12 pages).

* cited by examiner

<u>A1</u>

<u>A1</u>

<u>A1</u>

<u>A1</u>

<u>A1</u>

A1

<u>A8</u> z2(z)

y1(y) ◄──►y2(y)

z1(z)

A9

SEMICONDUCTOR DEVICE

TECHNICAL FIELD

The present disclosure relates to a semiconductor device.

BACKGROUND ART

Conventionally, a wire made of Al (aluminum) has been bonded to an electrode of a semiconductor element. In recent years, a power semiconductor device using a semiconductor material, mainly SiC (silicon carbide), has been developed. This power semiconductor element may have so high density of current flowing through the electrode that a lead member made of Cu or a wire made of Cu may be used instead of a wire made of Al. When the wire made of Cu is bonded, a plate member may be bonded to the electrode as a buffer member. That is, a connecting member made of Cu may be bonded to the electrode. Patent Document 1 discloses a semiconductor device using a sintered metal as a bonding material that bonds a connecting member to an electrode of the semiconductor element. In Patent Document 1, a sintering metallic material (a sintering silver film) displaced between the semiconductor element and a clip, which is the connecting member, is sintered, thereby the sintering metallic material becoming a sintered metal (a sintered silver) and bonding the clip and the semiconductor element each other. In the sintering process, the clip is pressed against the semiconductor element by a pressing member to press the sintering metallic material using the pressing force of the pressing member. The sintering metallic material in a pressed state is processed for heating.

In a semiconductor device on which a plurality of semiconductor elements are mounted, each of the semiconductor elements may be simultaneously bonded to connecting members. A slight margin of error may be allowed for a thickness of each of the semiconductor elements and each of the connecting members. A substrate or the like, on which each of the semiconductor elements is mounted, may have a slight bend. There may be also inconsistency in a thickness of a sintering metallic material that is disposed between the electrode of each of the semiconductor elements and the connecting member or between the substrate and each of the semiconductor elements. These may cause unevenness in the position (an overall height) of an upper surface (a surface facing the opposite side of the semiconductor elements) of the connecting members bonded to each of the semiconductor elements. In this case, when a single pressing member presses each of the connecting members, the load applied on each of the semiconductor elements may be uneven. The semiconductor elements given a large load may therefore be broken. Generally, a plurality of semiconductor devices may be manufactured simultaneously. Even in the semiconductor device with only one semiconductor element, a deviation of the load due to the inconsistency in the heights may cause the semiconductor elements to be broken during the sintering process in a pressed state.

PRIOR-ART DOCUMENT

Patent Document

Patent Document 1: JP-A-2018-504788

SUMMARY OF THE INVENTION

Problem to be Solved by the Invention

Considering the situations described above, an object of the present disclosure is to provide a semiconductor device that can eliminate unevenness of the load applied on semiconductor elements during the sintering process in a pressed state.

Means to Solve the Problem

A semiconductor device according to the present disclosure includes a first semiconductor element; a first connecting member; and a first member. The first semiconductor element has a first element obverse surface and a first element reverse surface that face opposite each other in a thickness direction, and has a first electrode disposed on the first element obverse surface. The first connecting member is electrically connected to the first electrode. The first member overlaps with the first electrode as viewed in the thickness direction, has a Vickers hardness lower than a Vickers hardness of the first connecting member, and has electrical conductivity.

Advantages of the Invention

According to the above configuration, the deviation of the load on the semiconductor elements during the sintering process in a pressed state can be suppressed.

Other features and advantages of the present disclosure will be more apparent from the detailed description given below with reference to the attached drawings.

MODE FOR CARRYING OUT THE INVENTION

Figure 1:
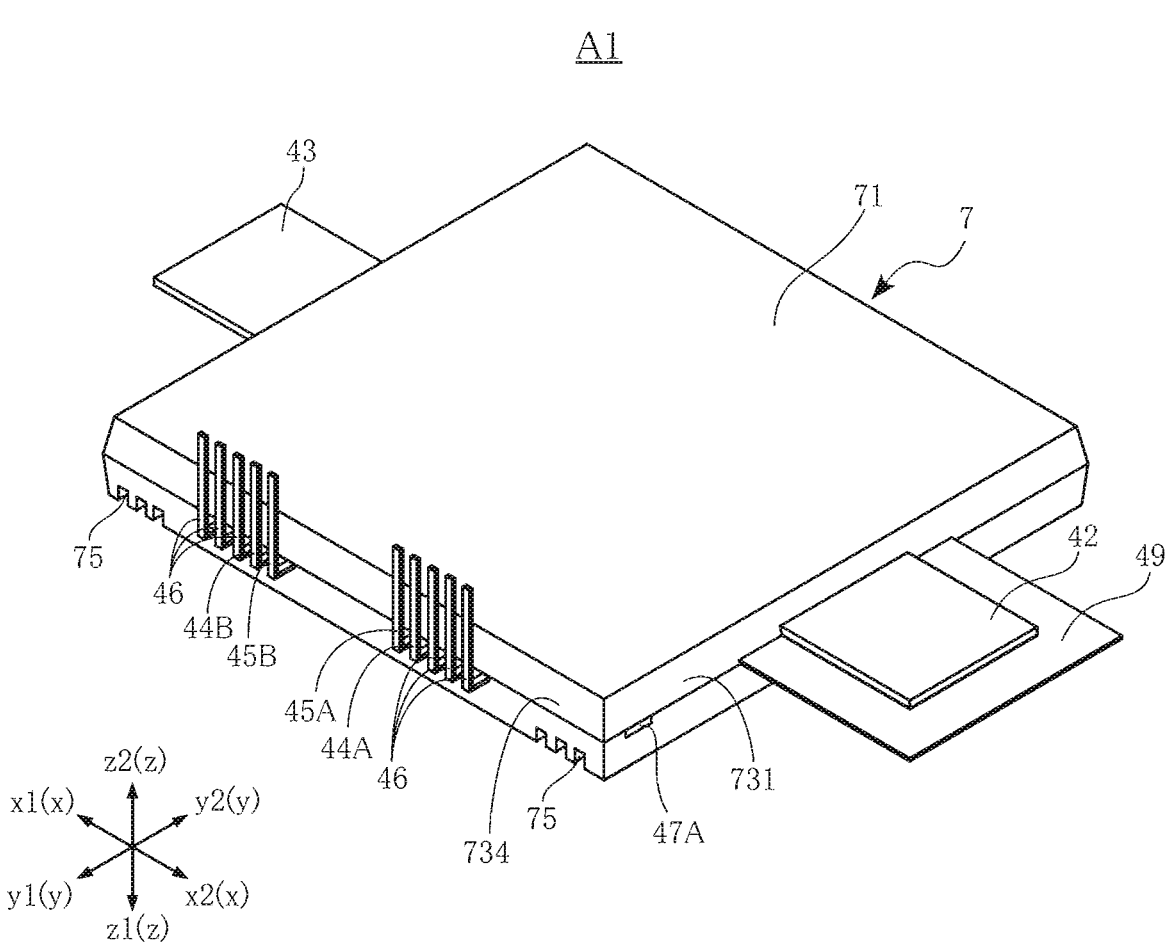
FIG. 1 is a perspective view of a semiconductor device according to a first embodiment of the present disclosure.

The following describes preferred embodiments of the present disclosure in detail with reference to the drawings.

In the description of the present disclosure, the expression "An object A is formed in an object B", and "An object A is formed on an object B" imply the situation where, unless otherwise specifically noted, "the object A is formed directly in or on the object B", and "the object A is formed in or on the object B, with something else interposed between the object A and the object B". Likewise, the expression "An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Still further, the expression "An object A overlaps with an object B as viewed in a certain direction" implies the situation where, unless otherwise specifically noted, "the object A overlaps with the entirety of the object B", and "the object A overlaps with a part of the object B".

Based on FIGS. 1 to 15, a semiconductor device according to a first embodiment of the present disclosure is described below. A semiconductor device A1 includes a plurality of semiconductor elements 10, a support substrate 20, a plurality of electro-conductive bonding layers 3, input terminals 41 and 42, an output terminal 43, a pair of gate terminals 44A and 44B, a pair of detection terminals 45A and 45B, a plurality of dummy terminals 46, a pair of side terminals 47A and 47B, an insulating member 49, a plurality of lead members 51, a plurality of buffer members 8, a plurality of wires 6, and a sealing resin 7. Note that the input terminals 41 and 42, the output terminal 43, the pair of gate terminals 44A and 44B, the pair of detection terminals 45A and 45B, the plurality of dummy terminals 46, and the pair of side terminals 47A and 47B may collectively be referred to as terminals 40.

Figure 2:
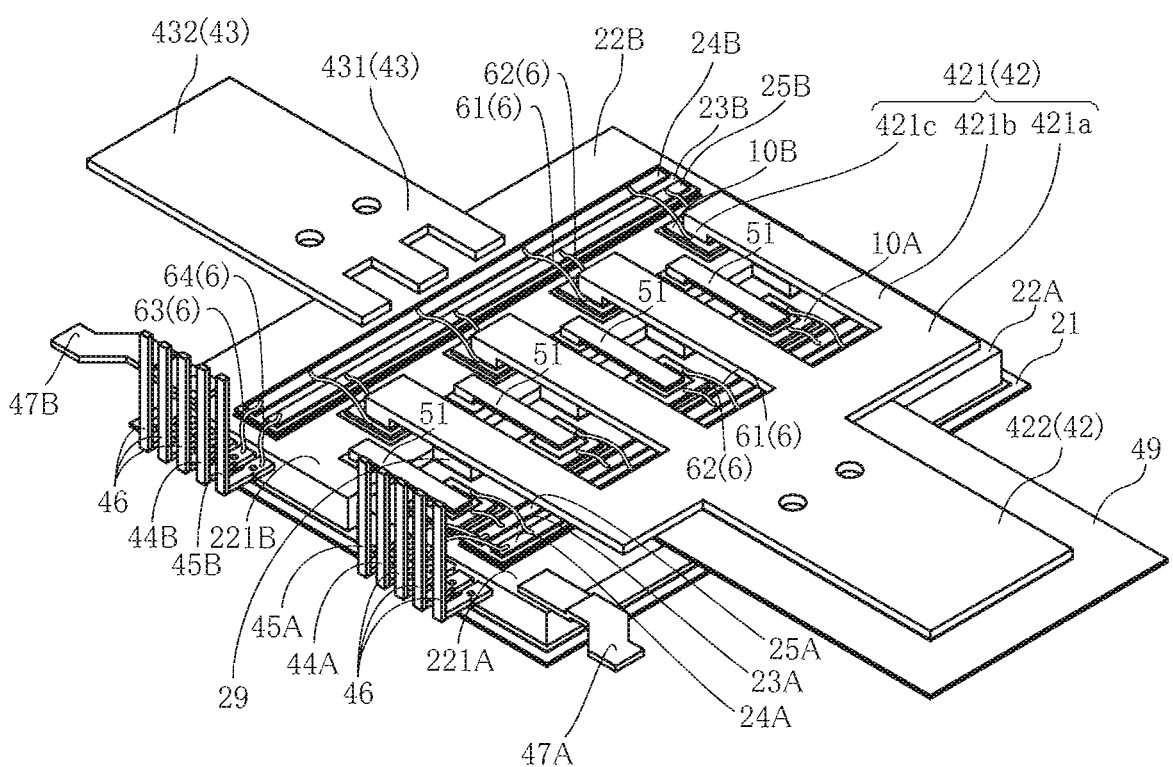
FIG. 2 is a perspective view of a semiconductor device shown in FIG. 1 from which the sealing resin is omitted.
Figure 2:
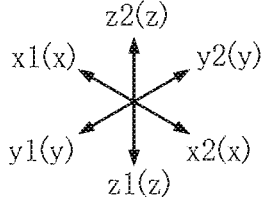
Figure 3:
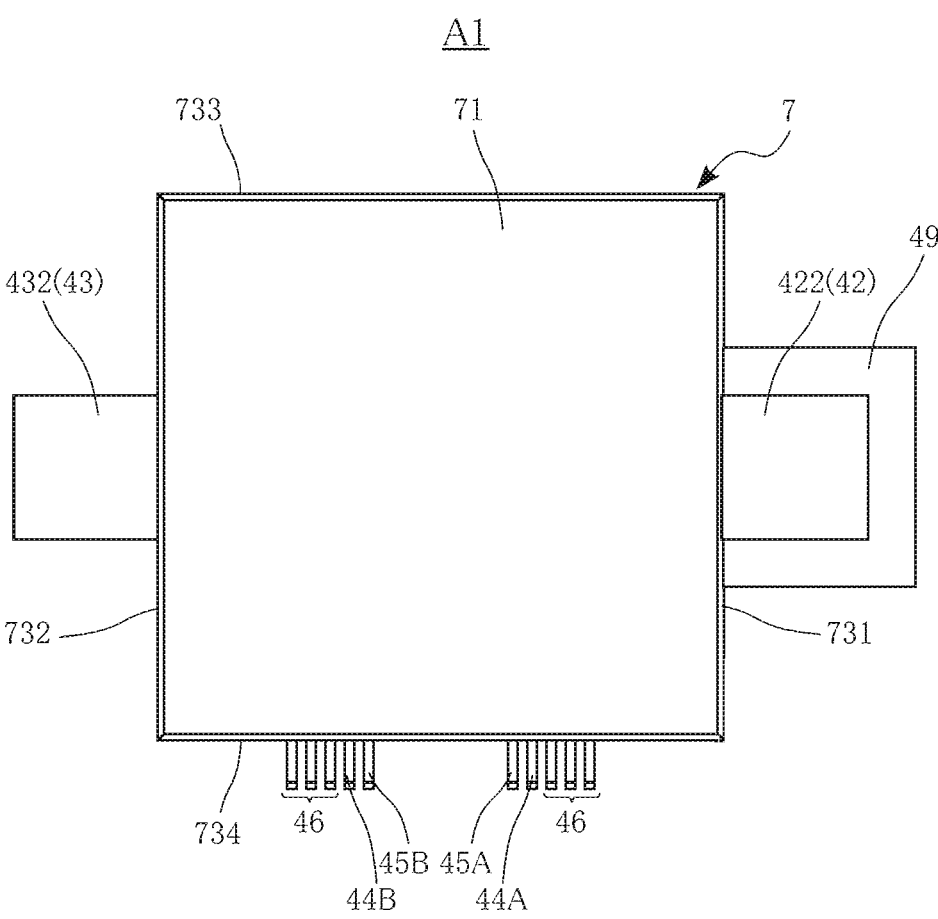
FIG. 3 is a plan view of a semiconductor device shown in FIG. 1.
Figure 3:
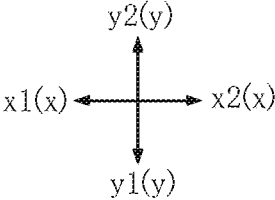
Figure 4:
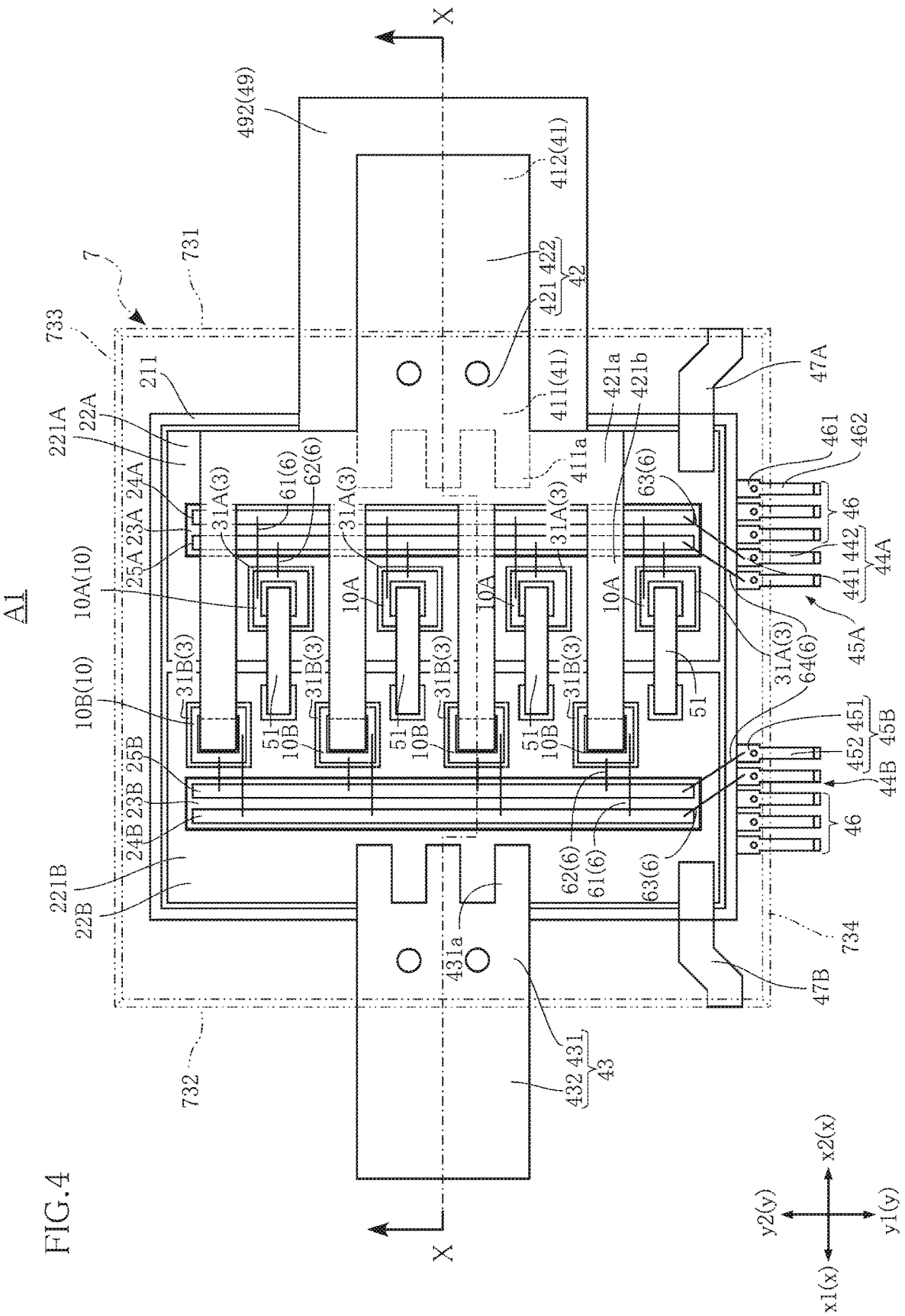
FIG. 4 is a plan view of a semiconductor device shown in FIG. 1 from which the sealing resin is omitted.
Figure 5:
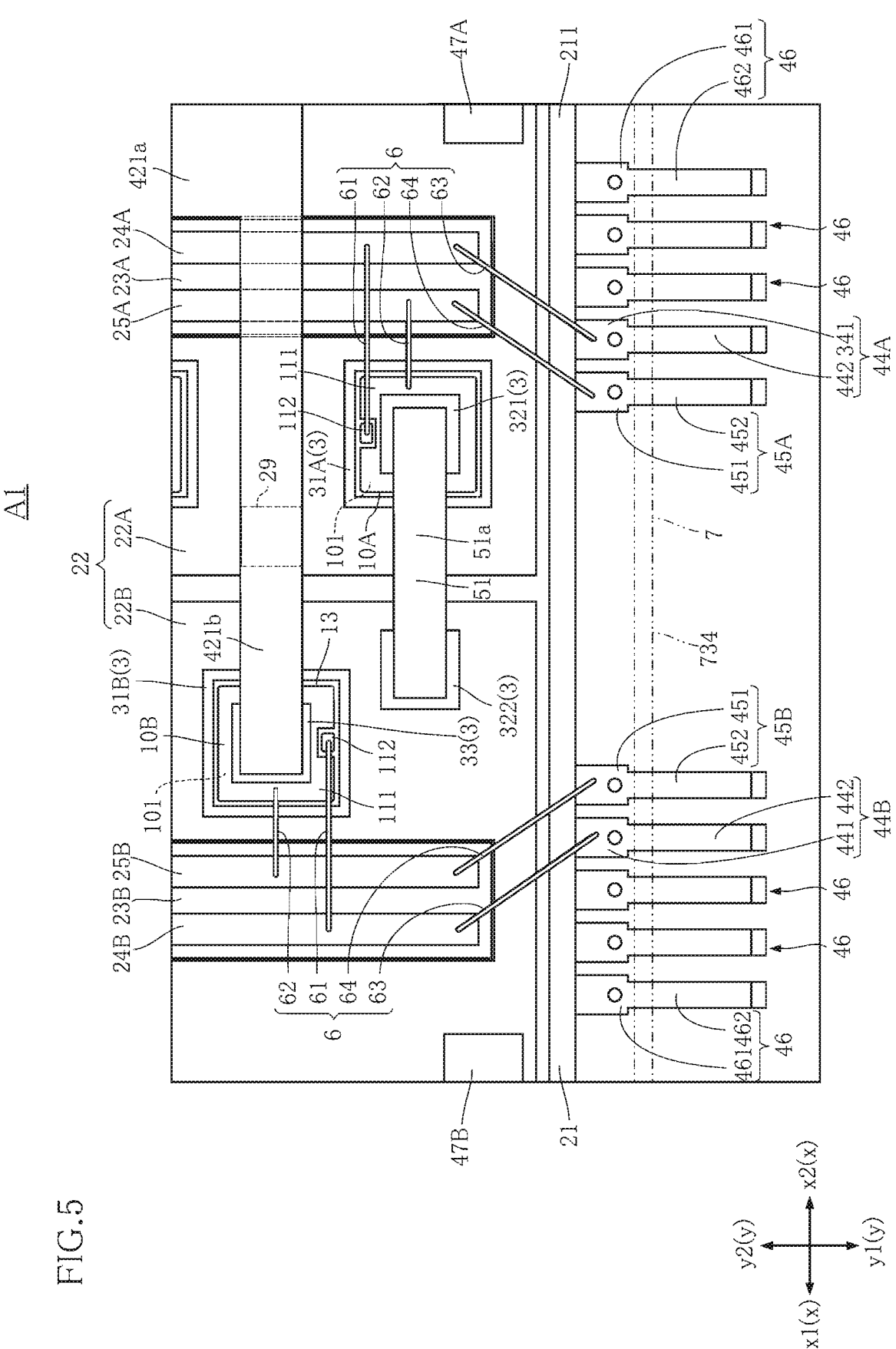
FIG. 5 is a partially enlarged plan view in which a portion of FIG. 4 is enlarged.
Figure 6:
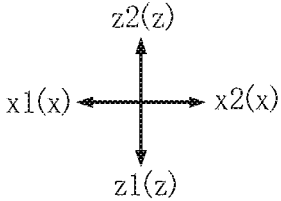
FIG. 6 is a front elevational view of a semiconductor device shown in FIG. 1.
Figure 7:
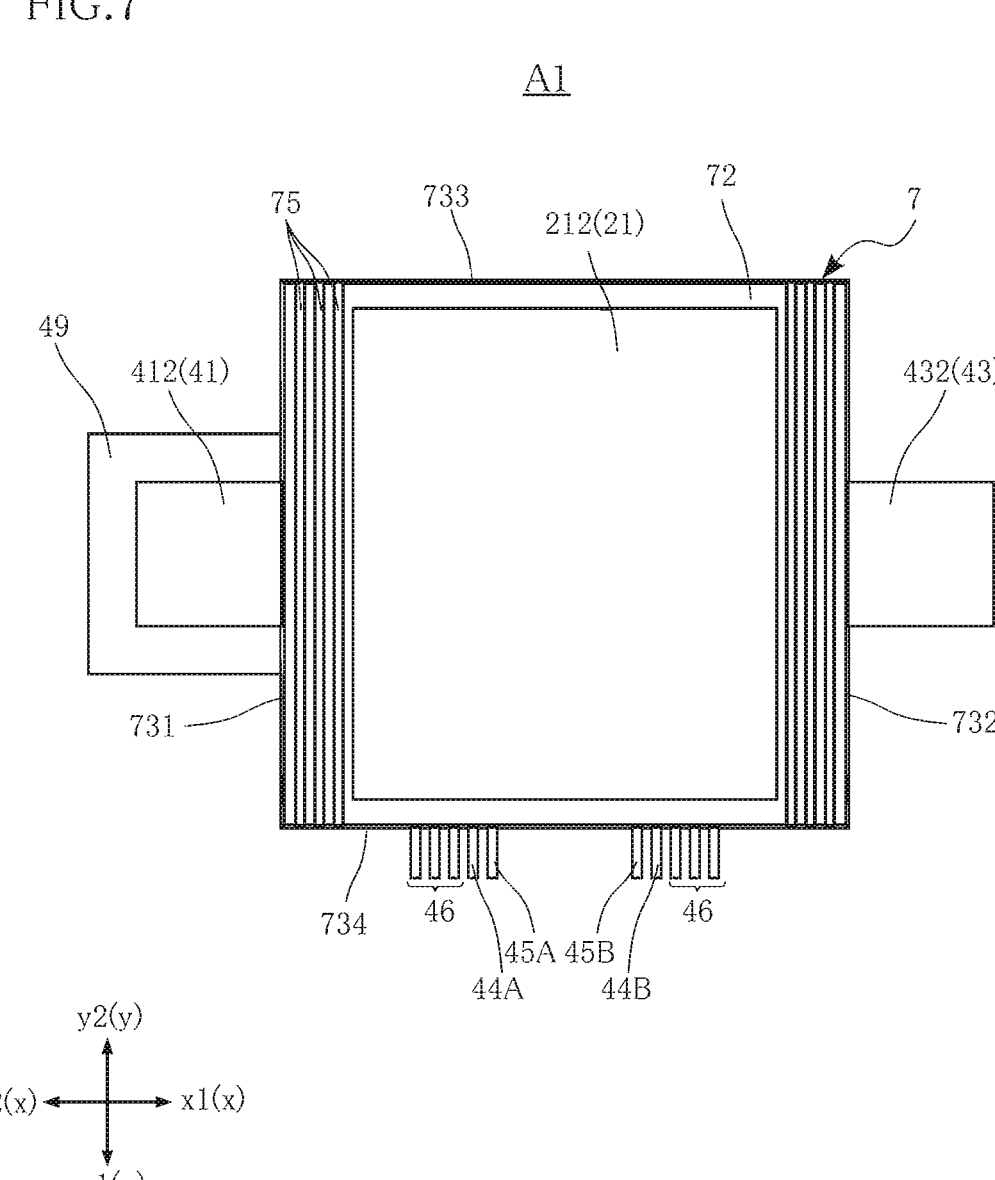
FIG. 7 is a bottom view of a semiconductor device shown in FIG. 1.
Figure 8:
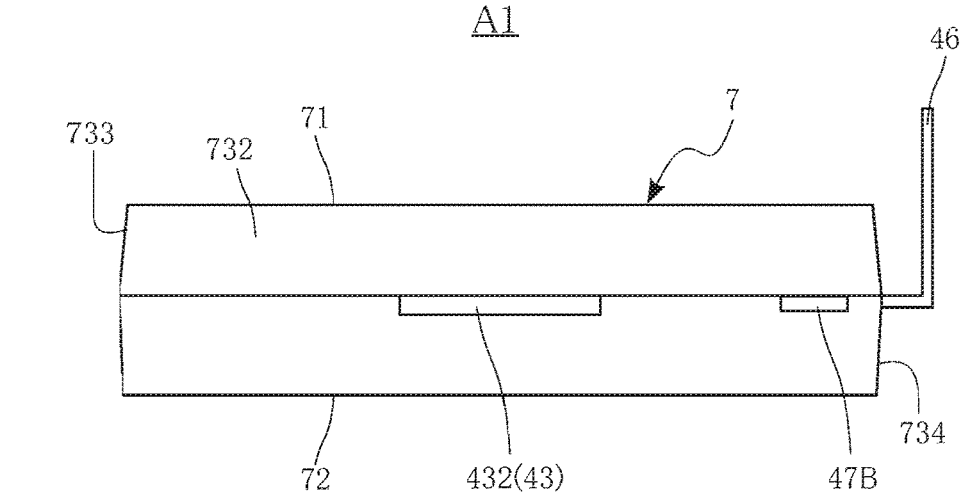
FIG. 8 is a left side view of a semiconductor device shown in FIG. 1.
Figure 8:
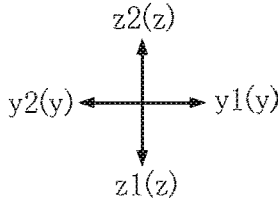
Figure 9:
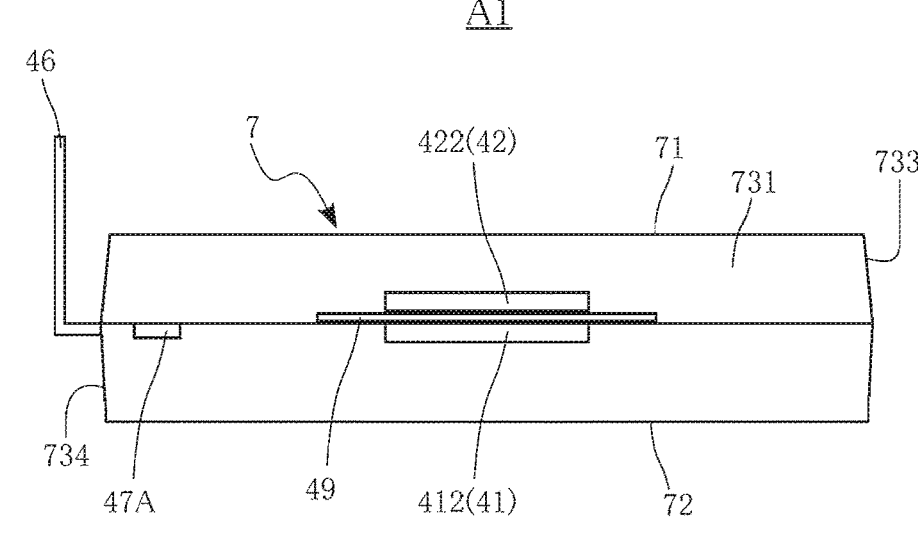
FIG. 9 is a right side view of a semiconductor device shown in FIG. 1.
Figure 9:
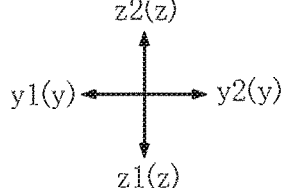
Figure 10:
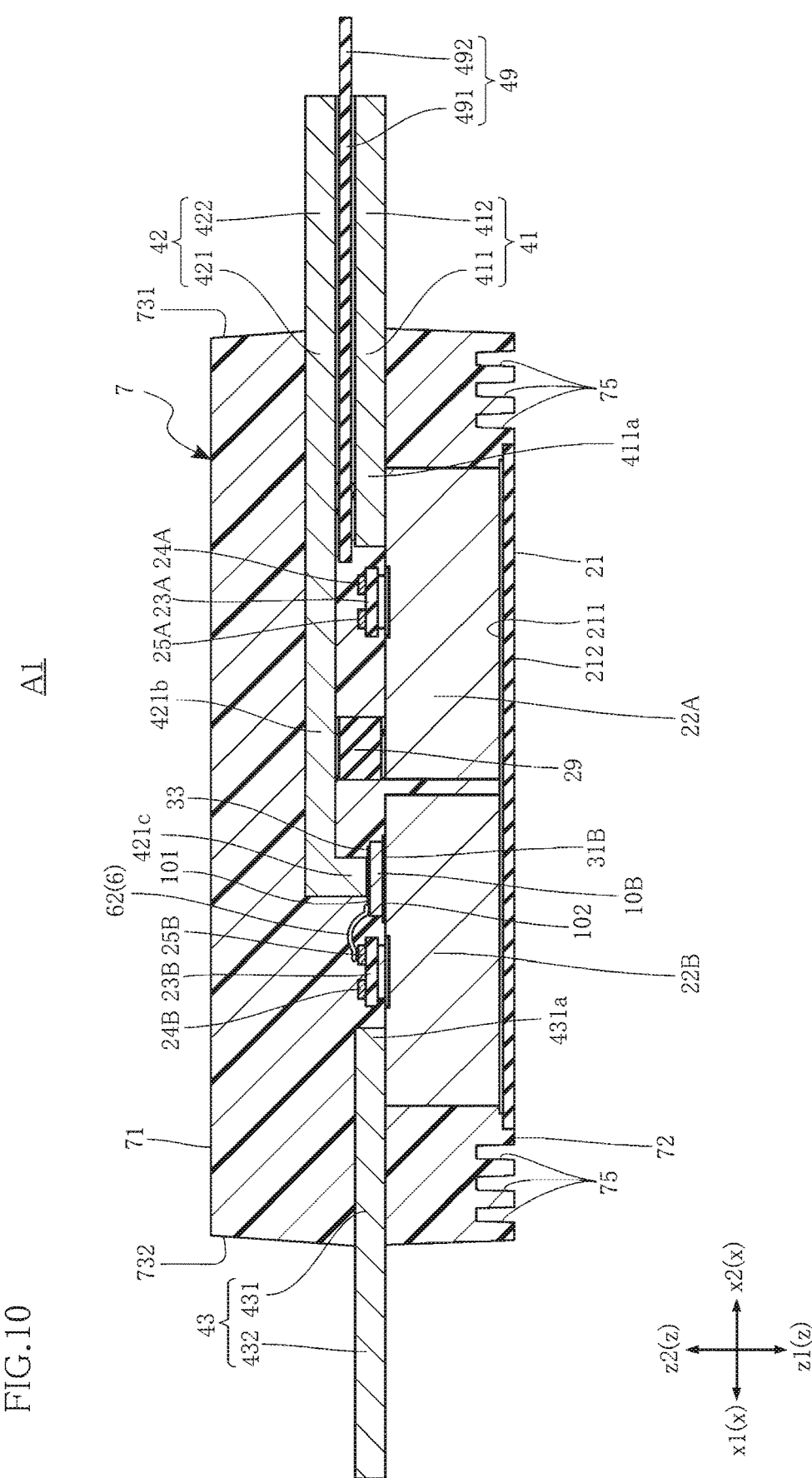
FIG. 10 is a cross-sectional view of FIG. 4 taken along a line X-X.
Figure 11:
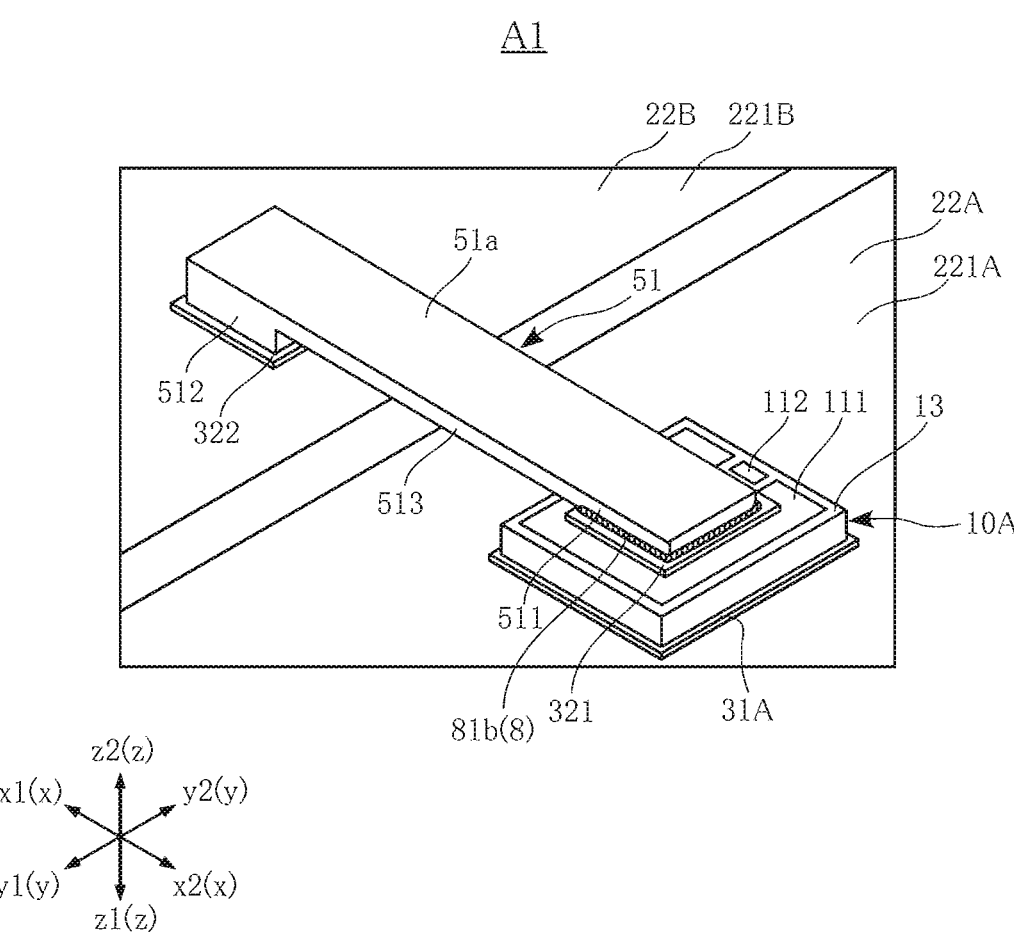
FIG. 11 is a partially enlarged plan view in which a portion of FIG. 2 is enlarged.
Figure 12:
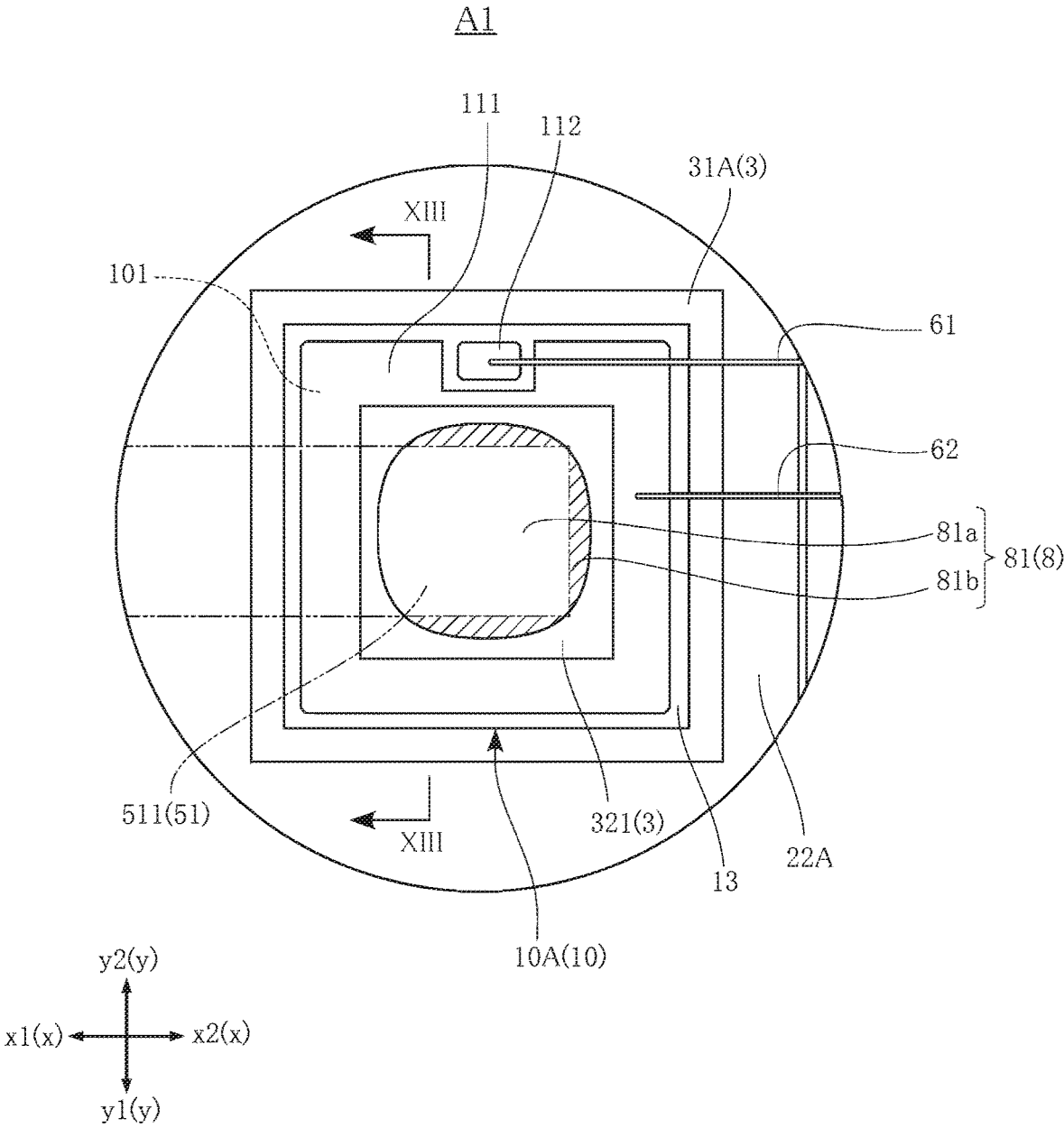
FIG. 12 is a partially enlarged plan view in which a portion of FIG. 4 is enlarged.
Figure 13:
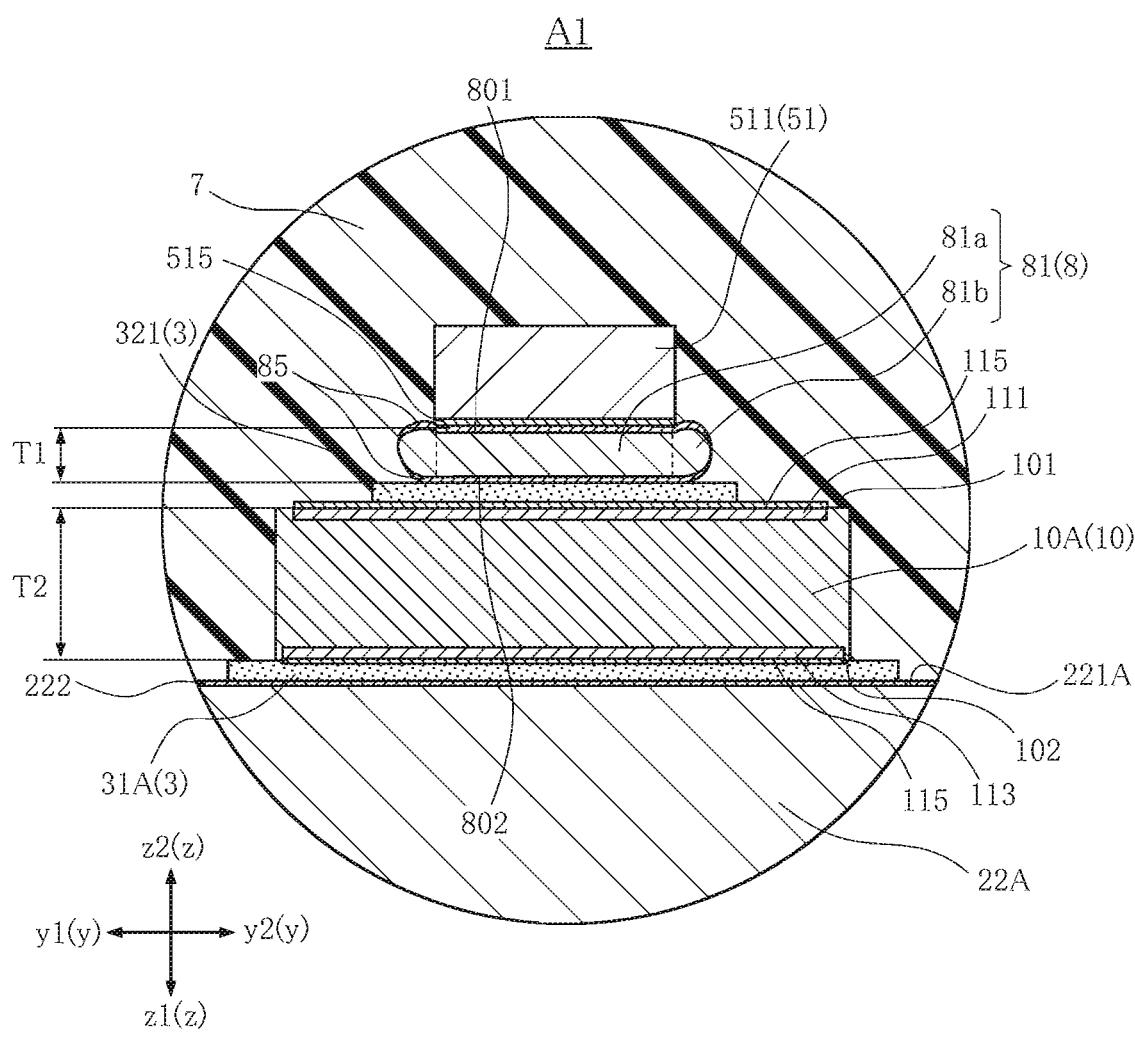
FIG. 13 is a cross-sectional view of FIG. 12 taken along a line XIII-XIII.
Figure 14:
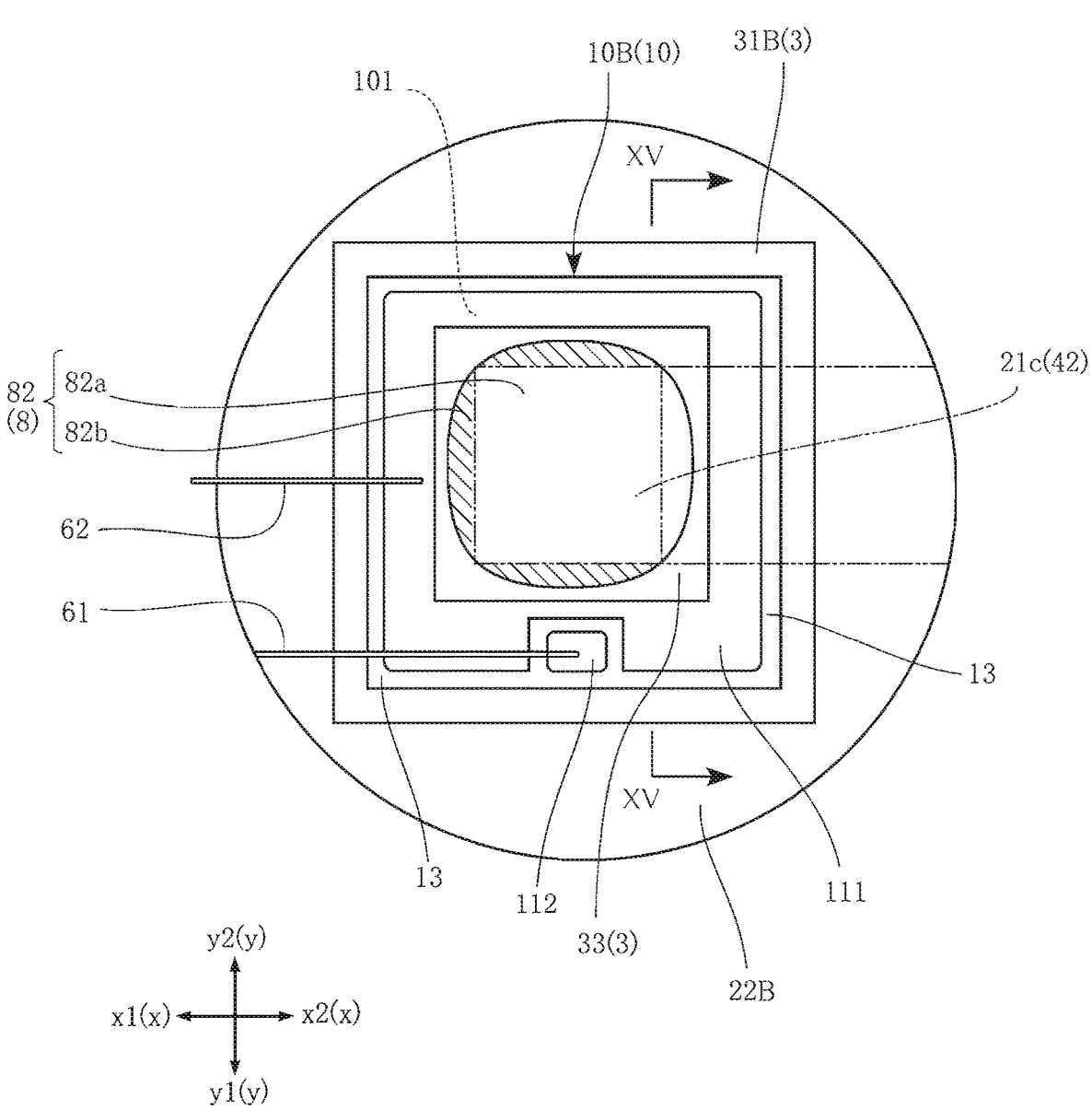
FIG. 14 is a partially enlarged plan view in which a portion of FIG. 4 is enlarged
Figure 15:
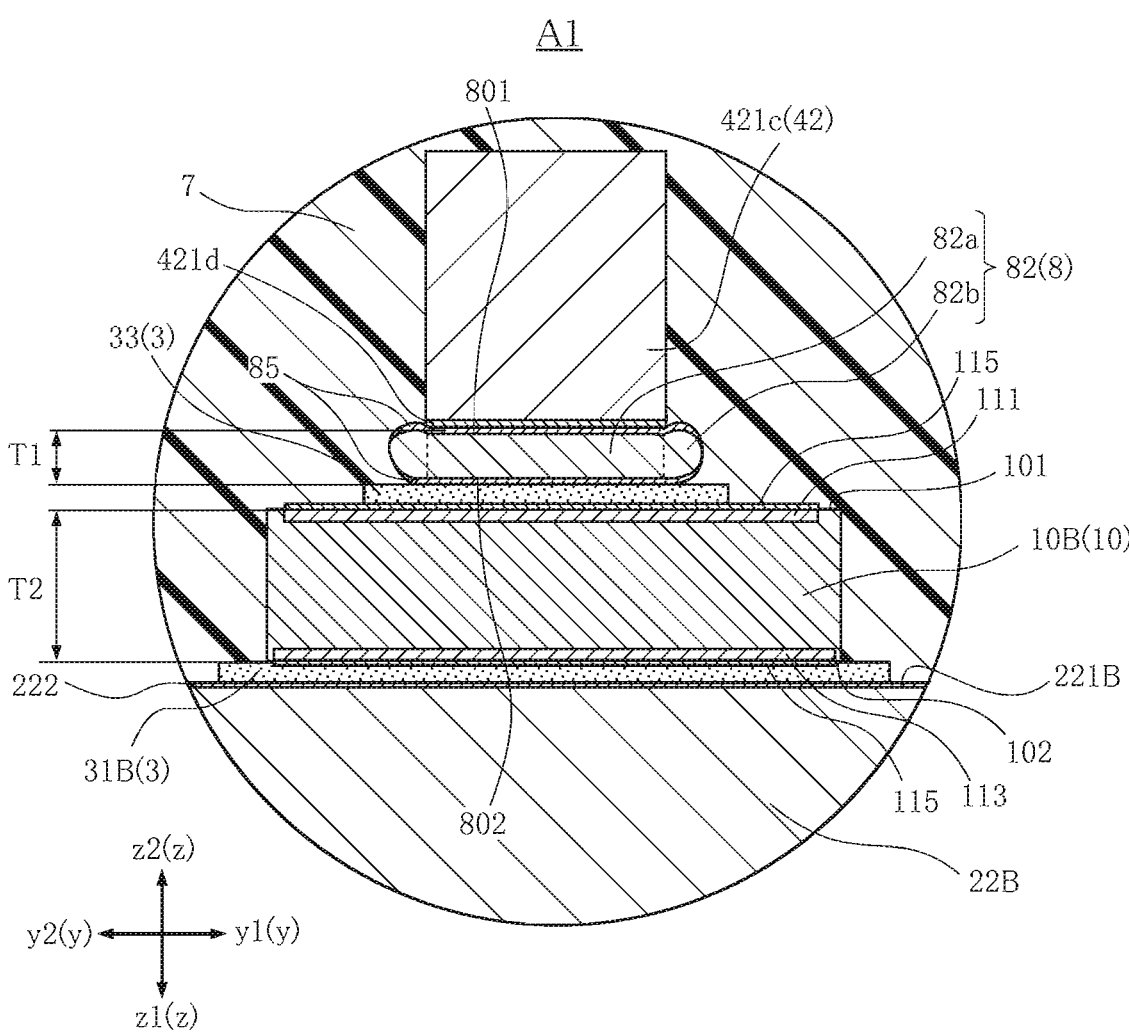
FIG. 15 is a cross-sectional view of FIG. 14 taken along a line XV-XV.

FIG. 1 is a perspective view of the semiconductor device A1. FIG. 2 is a perspective view of the semiconductor device A1 from which the sealing resin is omitted. FIG. 3 is a plan view of the semiconductor device A1. FIG. 4 is a plan view of the semiconductor device A1 from which the sealing resin is omitted. Note that, in FIG. 4, the sealing resin 7 is indicated by imaginary lines (dash-double dot lines). FIG. 5 is a partially enlarged plan view in which a portion of FIG. 4 is enlarged. FIG. 6 is a front elevational view of the semiconductor device A1. FIG. 7 is a bottom view of the semiconductor device A1. FIG. 8 is a left side view of the semiconductor device A1. FIG. 9 is a right side view of the semiconductor device A1. FIG. 10 is a cross-sectional view of FIG. 4 taken along a line X-X. FIG. 11 is a partially enlarged plan view in which a portion including a lead member 51 in the perspective view shown in FIG. 2 is enlarged. Note that, in FIG. 11, the wires 6 are omitted. FIG. 12 is a partially enlarged plan view in which a portion including a semiconductor element 10A (described below) in the plan view shown in FIG. 4 is enlarged. Note that, in FIG. 12, the lead member 51 is transparent and are indicated by imaginary lines (dash-double dot lines). FIG. 13 is a cross-sectional view of FIG. 12 taken along a line XIII-XIII. FIG. 14 is a partially enlarged plan view in which a portion including a semiconductor element 10B (described below) in the plan view shown in FIG. 4 is enlarged. Note that, in FIG. 14, the input terminal 42 is transparent and is indicated by imaginary lines (dash-double dot lines). FIG. 15 is a cross-sectional view of FIG. 14 taken along a line XV-XV.

The semiconductor device A1 has a rectangular shape as viewed in the thickness direction z (in plan view). For the convenience of description, the thickness direction (the plan-view direction) of the semiconductor device A1 is defined as a direction z, the direction that is along one side of the semiconductor device A1 and orthogonal to the z direction (the horizontal direction shown in FIGS. 3 and 4) is defined as an x direction, and the direction orthogonal to the x direction and the z direction (the vertical direction shown in FIGS. 3 and 4) is defined as a y direction. One side in the z direction (the lower side shown in FIGS. 6, 8, and 9) is defined as a z1 side, while another side in the z direction (the upper side shown in FIGS. 6, 8, and 9) is defined as a z2 side. One side in the x direction (the left side shown in FIGS. 3 and 4) is defined as an x1 side, while another side in the x direction (the right side shown in FIGS. 3 and 4) is defined as an x2 side. One side in the y direction (the lower side shown in FIGS. 3 and 4) is defined as a y1 side, while another side in the y direction (the upper side shown in FIGS. 3 and 4) is defined as a y2 side. The z direction is one example of "the thickness direction". The size of the semiconductor device A1 may vary.

Each of the plurality of semiconductor elements 10 is configured using a semiconductor material mainly containing SiC (silicon carbide). Note that the semiconductor material is not limited to SiC, but includes Si (silicon), GaAs (gallium arsenide), or GaN (gallium nitride) or the like. In the present embodiment, each semiconductor element 10 is a power MOSFET (Metal-Oxide-Semiconductor Field-Effect Transistor). Each semiconductor element 10 is not limited to a MOSFET, but includes a field effect transistor including MISFET (Metal-Insulator-Semiconductor FET), an IGBT (Insulated Gate Bipolar Transistors), an IC chip such as a bipolar transistor, an LSI, and the like. In the present embodiment, each semiconductor element 10 is the same and is an n-channel MOSFET. Each semiconductor element 10 has a rectangular shape as viewed in the thickness direction (in the plan view). In the present embodiment, the thickness (a length in the z direction) of each semiconductor element 10 is about 350 to 370 μm but may be about 100 μm. The shape and size in each direction of each semiconductor element 10 are not limited thereto.

Each semiconductor element 10 has, as shown in FIGS. 10, 13, and 15, an element obverse surface 101 and an element reverse surface 102. In each semiconductor element 10, the element obverse surface 101 and the element reverse surface 102 are spaced apart in the z direction and face opposite each other. In the present embodiment, the element obverse surface 101 faces the z2 side in the z direction, while the element reverse surface 102 faces the z1 side in the z direction. Each semiconductor element 10 represents one example of a "first semiconductor element" or a "second semiconductor element".

Each semiconductor element 10 includes, as shown in FIGS. 5, 11 to 15, a source electrode 111, a gate electrode 112, a drain electrode 113, and an insulating film 13.

The source electrode 111 and the gate electrode 112 are disposed on the element obverse surface 101. The source electrode 111 is greater than the gate electrode 112. In the present embodiment, the source electrode 111 is composed of one area, but may be separated into a plurality of areas. The drain electrode 113 is disposed on the element reverse surface 102. In the present embodiment, the drain electrode 113 is formed almost entirely on the element reverse surface 102. As shown in FIGS. 13 and 15, a plated layer 115 is formed on the source electrode 111, the gate electrode 112, and the drain electrode 113 respectively. In the present embodiment, the plated layer 115, for example, consists of a plurality of metal-plated layers formed by depositing Ni (nickel), Pd (palladium), and Au (gold) in this order. The configuration of the plated layer 115 is not limited. The outermost of the plated layer 115 may preferably have a metallic layer to form a metallic bond with the conductive bonding layers 3. The source electrode 111 represents one example of a "first electrode" or a "second electrode".

The insulating film 13 is provided on the element obverse surface 101. The insulating film 13 has an electrically insulating property. The insulating film 13 surrounds the source electrode 111 and the gate electrode 112 as viewed in the z direction. The insulating film 13 is formed, for example, by laminating an $SiO_2$ (silicon dioxide) layer, an $SiN_4$ (silicon nitride) layer, and a polybenzoxazole layer in this order on the element obverse surface 101. In the insulating film 13, a polyimide layer may be used instead of the polybenzoxazole layer.

The plurality of the semiconductor elements 10 includes a plurality of the semiconductor elements 10A and a plurality of the semiconductor elements 10B. In the present embodiment, the semiconductor device A1 forms a half-bridge type switching circuit. The plurality of semiconductor elements 10A constitute an upper arm circuit in the switching circuit, and the plurality of semiconductor elements 10B constitute a lower arm circuit in the switching circuit. The semiconductor device A1, as shown in FIGS. 2 and 4, includes four semiconductor elements 10A and four semiconductor elements 10B. The number of the semiconductor elements 10 is not limited thereto configuration, and can suitably be set according to the performance required for the semiconductor device A1.

Each of the plurality of semiconductor elements 10A is, as shown in FIGS. 2, 4, 5, and 11 to 13, mounted on the support substrate 20 (a conductive member 22A described later). In the present embodiment, the plurality of semiconductor elements 10A are arranged at equal intervals in the y direction and are spaced apart from each other. When each semiconductor element 10A is mounted on the conductive member 22A, the element reverse surface 102 faces the conductive member 22A. Each semiconductor element is, as shown in FIGS. 4, 5, and 11 to 13, conductively connected to the support substrate 20 (the conductive member 22A) via the conductive bonding layer 3 (an element bonding layers 31A described later).

Each of the plurality of semiconductor elements 10B is, as shown in FIGS. 2, 4, 5, 14, and 15, mounted on the support substrate 20 (a conductive member 22B described later). In the present embodiment, the plurality of semiconductor elements 10B are arranged at equal intervals in the y direction and are spaced apart from each other. When each semiconductor element 10B is mounted on the conductive member 22B, the element reverse surface 102 faces the conductive member 22B. Each semiconductor element is, as shown in FIGS. 4, 5, 10, 14, and 15, conductively connected to the support substrate 20 (the conductive member 22B) via the conductive bonding layer 3 (an element bonding layer 31B described later).

The support substrate 20 is a support member supporting the plurality of semiconductor elements 10. The support substrate 20 includes an insulating substrate 21, a plurality of conductive members 22, a pair of insulating layers 23A and 23B, a pair of gate layers 24A and 24B, and a pair of detection layers 25A and The insulating substrate 21 has, as shown in FIG. 10, a plurality of conductive members 22 thereon. The insulating substrate 21 has an electrically insulating property. The constituent material of the insulating substrate 21 is, for example, ceramics having excellent thermal conductivity. Examples of such ceramics include AlN (aluminum nitride), SiN (silicon nitride), and $Al_2O_3$ (aluminum oxide). In the present embodiment, the insulating substrate 21 has a rectangular shape as viewed in the z direction.

The insulating substrate 21, as shown in FIG. 10, has an obverse surface 211 and a reverse surface 212. The obverse surface 211 and the reverse surface 212 are spaced apart in the z direction and face opposite each other. The obverse surface 211 faces the z2 side, and the plurality of conductive members 22 are disposed thereon. The obverse surface 211 is covered with the sealing resin 7 together with the plurality of conductive members 22 and the plurality of semiconductor elements 10. The reverse surface 212 faces the z1 side in the z direction, and is exposed from the sealing resin 7 as shown in FIGS. 7 and 10. A heat sink, which is not shown, is connected to the reverse surface 212, for example. The configuration of the insulating substrate 21 is not limited above. For example, the insulating substrate 21 may be provided individually for each of the plurality of conductive members 22.

Each of the plurality of conductive members 22 is a metal plate. The constituent material of the metal plate is Cu (copper) or a Cu alloy. The plurality of conductive members 22 forms a conduction path to the plurality of semiconductor elements 10 together with the plurality of terminals 40. The plurality of conductive members 22 are spaced apart from each other and each of the plurality of conductive members 22 is disposed on the obverse surface 211 of the insulating substrate 21. Each conductive member 22 is bonded to the obverse surface 211 of the insulating substrate 21 with a bonding material such as a silver paste, a solder, or the like. The bonding material may be a conductive material or an insulating material. In the present embodiment, the length in the z direction of the conductive member 22 is approximately 0.4 to 3.0 mm, but may not be limited thereto. In the present embodiment, each conductive member 22, as shown in FIGS. 13 and 15, has plated layer 222 on its surface. The plated layer 222 is formed in contact with the surface of each conductive member 22 and covers at least a portion on which the semiconductor elements 10 are mounted. The plated layer 222 may cover all portions of each conductive member 22. In the present embodiment, the plated layer 222 includes, for example, Ag. The material of the plated layer 222 may not be limited as long as it is capable of forming a metallic bond with the conductive bonding layer 3.

The plurality of conductive members 22 include a conductive member 22A and a conductive member 22B. In the present embodiment, the conductive members 22A and 22B are arranged along the x direction on the insulating substrate 21. The conductive member 22A is, as shown in FIGS. 2, 4, and 10, disposed on the x2 side in the x direction more than the conductive member 22B. The conductive member 22A has an obverse surface 221A that faces the z2 side in the z direction, and the plurality of semiconductor elements 10A are mounted on the obverse surface 221A. The conductive member 22B has an obverse surface 221B that faces the z2 side in the z direction, and the plurality of semiconductor elements 10B are mounted on the obverse surface 221B. In the present embodiment, the conductive members 22A and 22B have a rectangular shape as viewed in the z direction. The configuration of the conductive member 22 is not limited above and can suitably be changed according to the number and placement of the plurality of semiconductor elements 10. The conductive members 22A and 22B represent one example of "a conductor".

The pair of insulating layers 23A and 23B have an electrical insulating property, and the constituent material thereof is, for example, glass epoxy resin. Each of the pair of insulating layers 23A and 23B, as shown in FIGS. 2 and 4, has a band shape extending in the y direction. The insulating layer 23A is bonded to the obverse surface 221A of the conductive member 22A. The insulating layer 23A is located on the x2 side in the x direction more than the plurality of semiconductor elements 10A. The insulating layer 23B is bonded to the obverse surface 221B of the conductive member 22B. The insulating layer 23B is located on the x1 side in the x direction more than the plurality of semiconductor elements 10B.

The pair of gate layers 24A and 24B have conductivity, whose constituent material is, for example, Cu. Each of the pair of gate layers 24A and 24B, as shown in FIGS. 2 and 4, has a band shape extending in the y direction. The gate layer 24A is disposed on the insulating layer 23A. The gate layer 24A is electrically connected to the gate electrode 112 of the semiconductor element 10A through the wire 6 (a gate wire 61 described later). The gate layer 24B is disposed on the insulating layer 23B. The gate layer 24B is electrically connected to the gate electrode 112 of the semiconductor element through the wire 6 (a gate wire 61 described later).

The pair of detection layers 25A and 25B have conductivity, and is, for example, made of, Cu. Each of the pair of detection layers 25A and 25B, as shown in FIGS. 2 and 4, has a band shape extending in the y direction. The detection layer 25A is disposed on the insulating layer 23A together with the gate layer 24A. The detection layer 25A is located adjacent to the gate layer 24A on the insulating layer 23A and is spaced apart from the gate layer 24A. In the present embodiment, the detection layer 25A is disposed closer to the plurality of semiconductor elements 10A than the gate layer 24A in the x direction. The detection layer is located on the x1 side relative to the gate layer 24A in the x direction. The position of the gate layer 24A and the detection layer 25A in the x direction may be reversed. The detection layer 25A is electrically connected to the source electrode 111 of the semiconductor element 10A via the wire 6 (a detection wire 62 described later). The detection layer 25B is disposed on the insulating layer 23B together with the gate layer 24B. The detection layer 25B is located adjacent to the gate layer 24B on the insulating layer 23B and is spaced apart from the gate layer 24B. In the present embodiment, the detection layer 25B is disposed closer to the plurality of semiconductor elements 10B than the gate layer 24B in the x direction. The detection layer 25B is located on the x2 side relative to the gate layer 24B in the x direction. The position of the gate layer 24B and the detection layer 25B in the x direction may be reversed. The detection layer 25B is electrically connected to the source electrode 111 of the semiconductor element 10B via the wire 6 (a detection wire 62 described later).

Each of a plurality of base portions 29 has an electrical insulating property and includes ceramic, for example. Each base portion 29 is, as shown in FIGS. 2 and 10, bonded to the obverse surface 221A of the conductive member 22A. In the present embodiment, each base portion 29 has a rectangular shape as viewed in the z direction. Each of the plurality of base portions 29 is arranged at equal intervals in the y direction and is spaced apart from each other. The length of each base portion 29 in the z direction is approximately equal to the sum of the length of the input terminal 41 in the z direction and the length of the insulating member 49 in the z direction. Each base portion 29 is bonded to support the input terminal 42, and consequently stabilizes the shape of the input terminal 42. The semiconductor device A1 may not include the plurality of base portions 29.

The input terminals 41 and 42 are each a metal plate. The constituent material of the metal plate is Cu or a Cu alloy. In the present embodiment, the input terminals 41 and 42 both have a length in the z direction of about 0.8 mm, but are not limited thereto. The input terminals 41 and 42 are, as shown in FIGS. 4 and 10, both located closer to the x2 side in the x direction in the semiconductor device A1. A power supply voltage is, for example, applied between the input terminal 41 and the input terminal 42. A power supply voltage may be directly applied from a power supply (not shown) to the input terminals 41 and 42. A power supply voltage may also be applied through bus bars (not shown) that are connected so as to sandwich the input terminals 41 and 42. A snubber circuit or the like may be connected in parallel between the input terminal 41 and the input terminal 42. The input terminal 41 is a positive electrode (P terminal), and the input terminal 42 is a negative electrode (N terminal). The input terminal 42 is spaced apart from both the input terminal 41 and the conductive member 22A in the z direction.

The input terminal 41 is electrically connected to each drain electrode 113 of the plurality of semiconductor elements 10A via the conductive member 22A. The input terminal 41, as shown in FIGS. 4 and 10, includes a pad portion 411 and a terminal portion 412.

The pad portion 411 is a portion of the input terminal 41 that is covered with the sealing resin 7. An end portion of the pad portion 411 on the x1 side in the x direction has a comb shape, and includes a plurality of comb teeth portions 411a. Each of the plurality of comb teeth portions 411a is conductively bonded to the obverse surface 221A of the conductive member 22A. The method of bonding includes a laser welding method using a laser beam, an ultrasonic bonding method or a method using a conductive bonding material.

The terminal portion 412 is a portion of the input terminal 41 that is exposed from the sealing resin 7. The terminal portion 412, as shown in FIGS. 7, 9, and 10, extends in the x2 side in the x direction from the sealing resin 7 as viewed in the z direction.

The input terminal 42 is electrically connected to each source electrode 111 of the plurality of semiconductor elements 10B. The input terminal 42, as shown in FIGS. 4 and 10, includes a pad portion 421 and a terminal portion 422.

The pad portion 421 is a portion of the input terminal 42 that is covered with the sealing resin 7. The pad portion 421 includes a connection portion 421a, a plurality of extending portions 421b, and a plurality of protruding portions 421c. The connection portion 421a has a band shape extending in the y direction. The connection portion 421a is connected to the terminal portion 422. The plurality of extending portions 421b have a band shape extending from the connection portion 421a toward the x1 side in the x direction. In the present embodiment, each extending portion 421b extends from the connection portion 421a until it overlaps with the semiconductor elements 10B as viewed in the z direction. The plurality of extending portions 421b are arranged along the y direction as viewed in the z direction and are spaced apart from each other. Each extending portion 421b has a surface facing the z2 side in the z direction. A portion of the surface of each extending portion 421b is in contact with each base portion 29, and each extending portion 421b is supported by the conductive member 22A via each base portion 29. The plurality of protruding portions 421c are portions protruding from the extending portions 421b to the z1 side in the z direction at the tip portion (an end of the x1 side in the x direction) of each extending portion 421b. Each protruding portion 421c eliminates each gap in the z direction between the extending portion 421b and the semiconductor element 10B. Each protruding portion 421c is conductively connected to the source electrode 111 of the semiconductor element 10B via the buffer member 8 and the conductive bonding layer 3 (terminal bonding layer 33 described later). Each protruding portion 421c overlaps with the source electrode 111 of the semiconductor element 10B as viewed in the z direction. In the present embodiment, a plated layer 421d, as shown in FIG. 15, covers the surface of each protruding portion 421c opposite to the semiconductor element 10B. The plated layer 421d may cover the other surface or the entire surface of the input terminal 42. In the present embodiment, the plated layer 421d, for example, includes Ag. The material of the plated layer 421d is not limited.

The terminal portion 422 is a portion of the input terminal 42 exposed from the sealing resin 7. The terminal portion 422, as shown in FIGS. 4 and 10, extends from the sealing resin 7 to the x2 side in the x direction as viewed in the z direction. The terminal portion 422 has a rectangular shape as viewed in the z direction. The terminal portion 422, as shown in FIGS. 4 and 10, overlaps with the terminal portion 412 of the input terminal 41 as viewed in the z direction. The terminal portion 422 is spaced apart from the terminal portion 412 toward the z2 side in the z direction. In the present embodiment, the shape of the terminal portion 422 is the same as the shape of the terminal portion 412. The input terminal 42 represents one example of "a first connecting member".

The output terminal 43 is a metal plate. The constituent material of the metal plate is, for example, Cu or a Cu alloy. The output terminal 43 is, as shown in FIGS. 2 and 4, located closer to the x1 side in the x direction in the semiconductor device A1. The output terminal 43 is electrically connected to the drain electrode 113 of the plurality of semiconductor elements via the conductive bonding layers 3. The output terminal 43 is also electrically connected to each source electrode 111 of the plurality of semiconductor elements 10A via lead members 51. The voltage power converted by the plurality of semiconductor elements 10 is output from the output terminal 43. The output terminal 43, as shown in FIGS. 2 and 4, includes a pad portion 431 and a terminal portion 432.

The pad portion 431 is a portion of the output terminal 43 that is covered with the sealing resin 7. The pad portion 431 has a comb shape and includes a plurality of comb teeth portions 431a on the x2 side in the x direction. Each of the plurality of comb teeth portions 431a is conductively bonded to the obverse surface 221B of the conductive member 22B. The method of bonding includes a laser welding method using a laser beam, an ultrasonic bonding method or a method using a conductive bonding material.

The terminal portion 432 is a portion of the output terminal 43 exposed from the sealing resin 7. The terminal portion 432, as shown in FIGS. 3, 6, 7, 8, and 10, extends from the sealing resin 7 to the x1 side in the x direction.

The pair of gate terminals 44A and 44B are, as shown in FIGS. 1 to 7, located adjacent to the conductive members 22A and 22B in the y direction. A gate voltage for driving the plurality of semiconductor elements 10A is applied on the gate terminals 44A. A gate voltage for driving the plurality of semiconductor elements is applied on the gate terminals 44B.

The pair of gate terminals 44A and 44B, as shown in FIGS. 4 and 5, both have a pad portion 441 and a terminal portion 442. In each of the gate terminals 44A and 44B, the pad portion 441 is covered with the sealing resin 7. Thereby, each of the gate terminals 44A and 44B is supported by the sealing resin 7. The surface of the pad portion 441 may be plated with silver, for example. The terminal portion 442 is connected to the pad portion 441 and is exposed from the sealing resin 7. The terminal portion 442 has an L shape as viewed in the x direction.

The pair of detection terminals 45A and 45B are, as shown in FIGS. 1 to 7, respectively located adjacent to the pair of gate terminals 44A and 44B in the x direction. At the detection terminal 45A, a voltage applied on each source electrode 111 of the plurality of semiconductor elements 10A is detected. At the detection terminal 45B, a voltage applied on each source electrode 111 of the plurality of semiconductor elements 10B is detected.

The pair of detection terminals 45A and 45B, as shown in FIGS. 4 and 5, both include a pad portion 451 and a terminal portion 452. In each of the detection terminals 45A and 45B, the pad portion 451 is covered with the sealing resin 7. Thereby, each of the detection terminals 45A and 45B is supported by the sealing resin 7. The surface of the pad portion 451 may be plated with silver, for example. The terminal portion 452 is connected to the pad portion 451 and is exposed from the sealing resin 7. The terminal portion 452 has an L shape as viewed in the x direction.

The plurality of dummy terminals 46 are, as shown in FIGS. 1 to 7, located on the opposite side of the pair of detection terminals 45A and 45B in the x direction relative to the pair of gate terminals 44A and 44B. In the present embodiment, the number of the dummy terminals 46 is six. Of these, three dummy terminals 46 are located on one side in the x direction (the x2 side in the x direction). The remaining three dummy terminals 46 are located on the other side in the x direction (the x1 side in the x direction). The plurality of dummy terminals 46 are not limited to the above configuration. The semiconductor device A1 may not include the plurality of dummy terminals 46.

Each of the plurality of dummy terminals 46, as shown in FIGS. 4 and 5, has a pad portion 461 and a terminal portion 462. In each dummy terminal 46, the pad portion 461 is covered with the sealing resin 7. Thereby, the plurality of dummy terminals 46 are supported by the sealing resin 7. The surface of the pad portion 461 may be plated with silver, for example. The terminal portion 462 is connected to the pad portion 461 and is exposed from the sealing resin 7. The terminal portion 462 has an L shape as viewed in the x direction. The shape of the terminal portion 462 is the same as the shape of each terminal portion 442 of the pair of gate terminals 44A and 44B and is the same as the shape of each terminal portion 452 of the pair of detection terminals 45A and 45B.

The pair of side terminals 47A and 47B, as shown in FIG. 4, overlap with an edge of the sealing resin 7 on the y1 side in the y direction as viewed in the z direction. The side terminal 47A overlaps with an edge of the sealing resin 7 on the x2 side in the x direction, and the side terminal 47B overlaps with edge of the sealing resin 7 on the x1 side in the x direction. The side terminal 47A is bonded to the conductive member 22A, and is covered with the sealing resin 7 except for an end face facing the x2 side in the x direction. The side terminal 47B is bonded to the conductive member 22B, and is covered with the sealing resin 7 except for an end face facing the x1 side in the x direction. In the present embodiment, all of the side terminals 47A and 47B overlap with the sealing resin 7 as viewed in the x direction. The bonding method of each of the side terminals 47A and 47B includes a laser welding method using a laser beam, an ultrasonic bonding method or a method using a conductive bonding material. Each of the side terminals 47A and 47B has a bent part as viewed in the z direction, and has another part bent in the z direction. The configuration of each of the side terminals 47A and 47B is not limited thereto. For example, the side terminals 47A and 47B may extend until they respectively protrude from the sealing resin 7 as viewed in the z direction. The semiconductor device A1 may not include the side terminals 47A and 47B.

The pair of gate terminals 44A and 44B, the pair of detection terminals 45A and 45B, and the plurality of dummy terminals 46 are, as shown in FIGS. 1 to 7, arranged along the x direction as viewed in the z direction. In the semiconductor device A1, the pair of gate terminals 44A and 44B, the pair of detection terminals 45A and 45B, the plurality of dummy terminals 46, and the pair of side terminals 47A and 47B are all formed from the same lead frame.

The insulating member 49 has an electrical insulating property, and is, for example, made of insulating paper. A part of the insulating member 49 is a flat plate, and is, as shown in FIGS. 6, 9, and 10, sandwiched between the terminal portion 412 of the input terminal 41 and the terminal portion 422 of the input terminal 42 as viewed in the z direction. All of the input terminal 41 overlaps with the insulating member 49 as viewed in the z direction. In the input terminal 42, a part of the pad portion 421 and all of the terminal portion 422 overlap with the insulating member 49 as viewed in the z direction. The insulating member 49 insulates the two input terminals 41 and 42 from each other. A part of the insulating member 49 (a part on the x1 side in the x direction) is covered with the sealing resin 7.

The insulating member 49, as shown in FIG. 10, includes an interposing portion 491 and an extending portion 492. The interposing portion 491 is interposed between the terminal portion 412 of the input terminal 41 and the terminal portion 422 of the input terminal 42 in the z direction. All of the interposing portion 491 is sandwiched between the terminal portion 412 and the terminal portion 422. The extending portion 492 extends from the interposing portion 491 toward the x2 side in the x direction than the terminal portion 412 and the terminal portion 422.

The plurality of lead members 51 are electrically connected to the source electrodes 111 of the semiconductor elements 10A, respectively. Each lead member 51 electrically connects the source electrodes 111 of the semiconductor elements 10A to the conductive member 22B. Each lead member 51 has a rectangular shape extending in the x direction as viewed in the z direction. Each lead member 51 includes a first bonding portion 511, a second bonding portion 512, and a connection portion 513.

The first bonding portion 511 is a portion conductively connected to the source electrode 111 of the semiconductor element 10A via the buffer member 8 and the conductive bonding layer 3 (a lead bonding layer 321 described later). The first bonding portion 511 overlaps with the source electrode 111 of the semiconductor element 10A as viewed in the z direction. In the present embodiment, the surface of the first bonding portion 511 opposite to the semiconductor element 10A, as shown in FIG. 13, has a plated layer 515. The plated layer 515 may cover the other surface or the entire surface of the lead member 51. In the present embodiment, the plated layer 515, for example, includes Ag. The material of the plated layer 515 is not limited. In the present embodiment, the length in the z direction (the thickness) of the first bonding portion 511 is about 160 to 200 μm. The thickness of the first bonding portion 511 is not limited thereto.

The second bonding portion 512 is a portion bonded to the conductive member 22B via the conductive bonding layer 3 (a lead bonding layer 322 described later). In the present embodiment, the surfaces of the second bonding portions 512 opposite to the conductive member 22B, as shown in FIG. 13, also has the plated layer 515. The thickness of the second bonding portion 512 is greater than the thickness of the first bonding portion 511. In the present embodiment, the length in the z direction (the thickness) of the second bonding portion 512 is about 500 to 700 μm. The thickness of the second bonding portion 512 is not limited thereto.

The connection portion 513 is a portion connected to the first bonding portion 511 and the second bonding portion 512. The surface of the connection portion 513 facing the z1 side in the z direction is in contact with the sealing resin 7. The thickness of the connection portion 513, which is about 160 to 200 μm, is the same as the thickness of the first bonding portion 511. The thickness of the connection portion 513 is not limited thereto. The lead member 51 represents one example of a "first connecting member" or a "second connecting member".

The plurality of buffer members 8 transform so that the load applied on each semiconductor element 10 is equalized during the pressurization and heating process described later. The plurality of buffer members 8 include a plurality of buffer members 81 and a plurality of buffer members 82. The plurality of buffer members 81 are each interposed between the source electrode 111 of the semiconductor element 10A and the first bonding portion 511 of the lead member 51, as shown in FIGS. 12 and 13. The plurality of buffer members 81 individually overlap with the source electrodes 111 of the semiconductor elements 10A as viewed in the z direction. The plurality of buffer members 82 are each interposed between the source electrodes 111 of the semiconductor elements 10B and protruding portions 421*c* of the input terminal 42, as shown in FIGS. 14 and 15. The plurality of buffer members 82 individually overlap with the source electrodes 111 of the semiconductor elements 10B as viewed in the z direction. The buffer members 81 and the buffer members 82 are referred to as the buffer members 8 when they are described without distinction.

Each of the plurality of buffer members 8, as shown in FIGS. 13 and 15, includes an obverse surface 801 and a reverse surface 802. The obverse surface 801 and the reverse surface 802 are spaced apart in the z direction and face opposite each other. In the present embodiment, the obverse surface 801 faces the z2 side in the z direction, and is opposite to the first bonding portion 511 of the lead member 51 or the protruding portion 421*c* of the input terminal 42. The reverse surface 802 faces the z1 side in the z direction, and is opposite to the source electrode 111 of the semiconductor element 10. The obverse surface 801 and the reverse surface 802 have plated layers 85 thereon. The plated layers 85 are formed in contact with the obverse surface 801 or the reverse surface 802. In the present embodiment, the plated layers include Ag, for example. The buffer member 81 and the first bonding portion 511 of the lead member 51 are, as shown in FIG. 13, bonded by solid phase diffusion bonding between the plated layer 85 (including Ag) formed on the obverse surface 801 of the buffer member 81 and the plated layer 515 (including Ag) formed on the first bonding portion 511. The buffer member 82 and the protruding portion 421*c* of the input terminal 42 are, as shown in FIG. 15, bonded by solid phase diffusion bonding between the plated layer 85 (including Ag) formed on the obverse surface 801 of the buffer member 82 and the plated layer 421*d* (including Ag) formed on the protruding portion 421*c*. Each buffer member 8 is, as shown in FIGS. 13 and 15, bonded to the source electrode 111 of the semiconductor element 10 with the conductive bonding layer 3. Each buffer member 8 may also be bonded with the first bonding portion 511 or the protruding portion 421*c* with the conductive bonding layer 3. The material of the plated layer 85 is not limited.

The buffer member 8 has a Vickers hardness lower than each Vickers hardness of the lead member 51 and input terminal 41, and has electrical conductivity. In the present embodiment, the constituent material of each lead member 51 and input terminal 41 is Cu, and hence each buffer member 8 includes a material whose Vickers hardness is lower than Cu, such as Al. The Vickers hardness (unit: HV) is an index of hardness that is obtained by pressing a pyramid-shaped indenter made of diamond into the surface of the material at a test load and dividing the test load by the surface area of the indentation formed with the indenter. The constituent material of the buffer member 8 is not limited unless the Vickers hardness is lower than the Vickers hardness of the lead member 51 and the input terminal 41. The Vickers hardness of each buffer member 8 is preferably equal to or less than 50 HV and equal to or greater than 1 HV, which includes Sn (tin), In (indium), and Zn (zinc), for example. Each buffer member 8 transforms when each lead member 51 or the input terminal 42 is pressed against the semiconductor elements 10 during the pressurization and heating process, so that eliminates an unevenness of the load applied on the semiconductor elements 10.

Figure 16A:
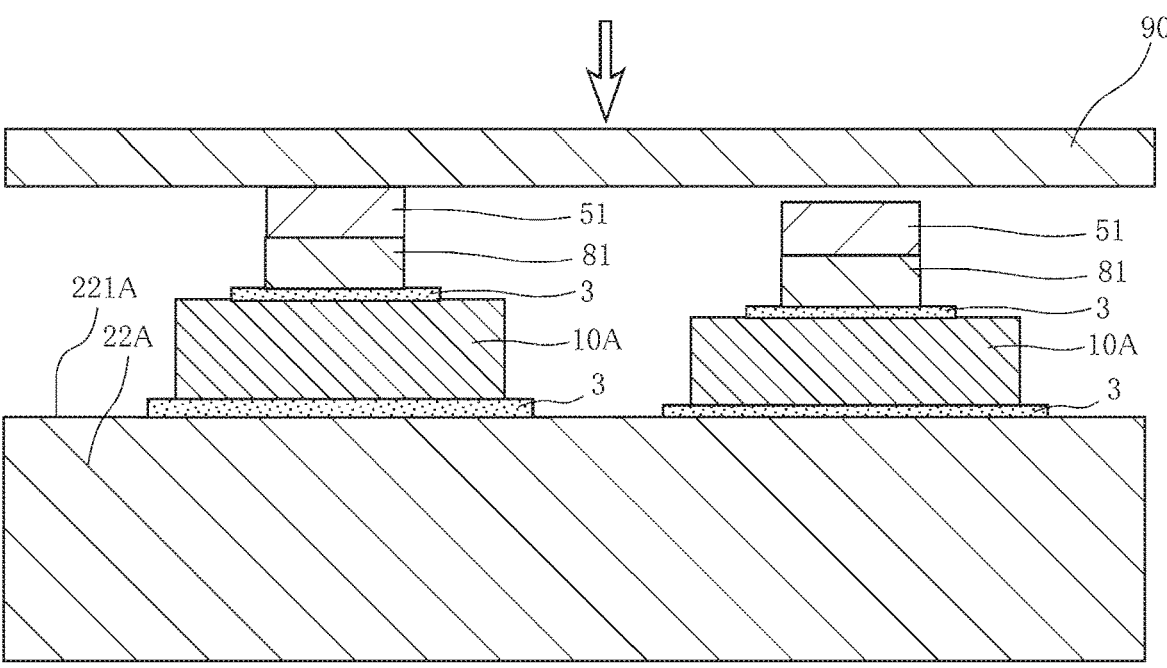
FIG. 16A is a schematic view for explaining a pressure heating step, which shows the state before two buffer members transform.
Figure 16B:
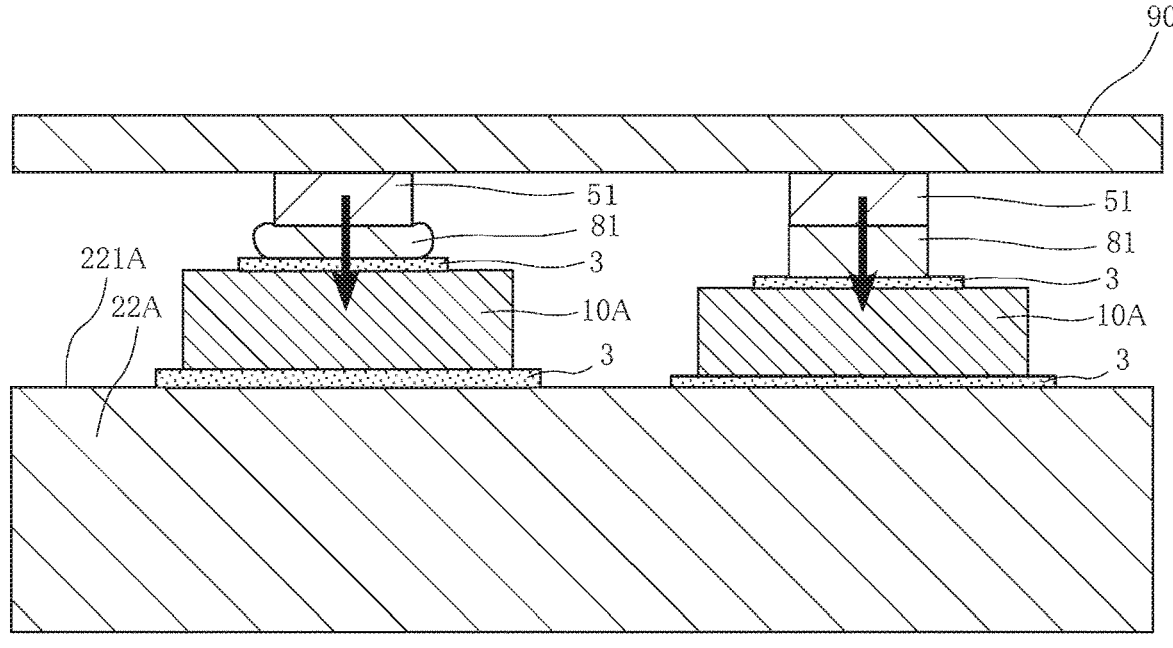
FIG. 16B is a schematic view for explaining a pressure heating step, which shows the state after one of the buffer members transforms.
Figure 16B:
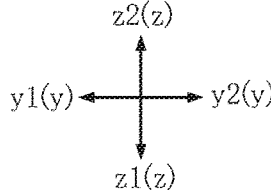

FIGS. 16A and 16B are schematic views for explaining the state that the load applied on each of the semiconductor elements is equal due to the transformation of the buffer members 8 during the pressurization and heating process. FIG. 16A shows two semiconductor elements 10A mounted on the conductive member 22A, lead members 51 conducting to each semiconductor element 10A, and buffer members 81 each disposed between the semiconductor element and the lead member 51. Each buffer member 81 does not transform yet at this stage. The thickness of the left semiconductor element 10A is greater than the right semiconductor element 10A, and the thickness of the left conductive bonding layer 3 is also greater than the right conductive bonding layer 3. The distance between the obverse surface 221A of the conductive member 22A and the upper surface 221A of the lead member 51 (the surface facing the opposite side of the semiconductor elements 10A) is greater on the left one than the right one.

FIG. 16B shows the pressing state that a pressing member 90 presses each lead member 51. The buffer member 81 above the left semiconductor element 10A is transformed into a press-fit shape by the pressure. Thereby, the thickness of the buffer member 81 is reduced, and the distance between the obverse surface 221A of the conductive member 22A and the upper surface of the lead member 51 is generally equal between the left one and the right one. The load applied on the left semiconductor element 10A and the load applied on the right semiconductor element 10A are generally the same, so that the two semiconductor elements 10A are equally loaded.

None of the plurality of the buffer members 8 may not transform and hold the shape before the pressurization and heating process. On the other hand, any of the plurality of the buffer members 8 may transform during the pressurization and heating process. FIGS. 12 and 13 show the transformed buffer member 81. In the present embodiment, the shape of the pre-transformed buffer member 81 is a rectangular shape with the same size as the first bonding portion 511 of the lead members 51 as viewed in the z direction. The buffer member 81, as shown in FIG. 12, has a bulge with an outer line curvilinear due to the press-fit by the pressure. The cross-section of the buffer members 81, as shown in FIG. 13, has an outwardly protruding shape with both ends arcuate in the directions orthogonal to the z direction. The buffer member 81, as shown in FIGS. 12 and 13, includes a first portion 81*a* and a second portion 81*b*. The first portion 81*a* is a portion overlapping with the lead member 51 as viewed in the z direction. The second portion 81*b* is a portion connecting to the first portion 81*a* and protrudes beyond the lead member 51 as viewed in the z direction. In FIGS. 12 and 13, the second portion 81*b* is hatched. In FIG. 13, the boundary between the first portion 81*a* and the second portion 81*b* is indicated by a broken line.

FIGS. 14 and 15 show the transformed buffer member 82. In the present embodiment, the shape of the pre-transformed buffer members 81 is a rectangular shape with the same size as each protruding portion 421*c* of the input terminal 42 as viewed in the z direction. The buffer member 82, as shown in FIG. 14, has a bulge with an outer line curvilinear due to the press-fit by the pressure. The cross-section of the buffer member 82, as shown in FIG. 15, has an outwardly protruding shape with both ends arcuate in the directions orthogonal to the z direction. The buffer member 82, as shown in FIGS. 14 and 15, includes a first portion 82a and a second portion 82b. The first portion 82a is a portion overlapping with the input terminal 42 as viewed in the z direction. The second portion 82b is a portion connecting to the first portion 82a and protrudes beyond the input terminal 42 as viewed in the z direction. In FIG. 14, the second portion 82b is hatched. In FIG. 15, the boundary between the first portion 82a and the second portion 82b is indicated by a broken line.

The thickness (the length in the z direction) T1 of the buffer member 8 is, as shown in FIGS. 13 and 15, equal to or greater than 10% and equal to or less than 30% of the thickness (the length in the z direction) T2 of the semiconductor element 10. The thickness T1 of the buffer member 81 without transformation (before the transformation) is also equal to or greater than 10% and equal to or less than 30% of the thickness T2. If the thickness T1 is too low, the transformation does not lead the equalization of the loads. On the other hand, the thickness T1 need not be too large from the point of view of reducing the amount of required materials. In the present embodiment, as the thickness T2 is about 350 to 370 μm, the thickness T1 of the buffer member 8 without the transformation (before the transformation) is about 50 to 100 μm. The thickness T1 is not limited but is suitably set. The thickness T1 needs a certain size and is designed at 50 to 100% of the thickness T2 if the thickness T2 is low (for example 100 μm). Each buffer member 8 represents one example of a "first member" or a "second member".

Each of the plurality of conductive bonding layers 3 includes a sintered metal formed by the sintering process. In the present embodiment, the constituent material of each conductive bonding layer 3 is, for example, a sintered silver. The constituent material of each conductive bonding layer 3 is not limited thereto, but includes the other sintered metal material such as a sintered copper. Each conductive bonding layer 3 is porous with a number of micropores, and in the present embodiment, the micropores are voids but the micropores may be filled with, for example, epoxy resin. That is, each conductive bonding layer 3 may be a sintered metal containing an epoxy resin. However, if the content of the epoxy resin is large, the conductivity of the conductive bonding layer 3 is reduced. Hence, the content of the epoxy resin is determined in consideration of the amount of current in the semiconductor devices A1. Each conductive bonding layer 3 is formed by sintering a metallic material. In the present embodiment, the cross-section of each conductive bonding layer 3 has, for example as shown in FIGS. 13 and 15, a rectangular shape, but may have a trapezoidal shape, a shape curved on the sides, or a shape formed with a fillet.

In the present embodiment, the plurality of conductive bonding layers 3 include a plurality of element bonding layers 31A and 31B, a plurality of lead bonding layers 321 and 322, and a plurality of terminal bonding layers 33.

Each of the plurality of element bonding layers 31A is for bonding each semiconductor element 10A to the conductive member 22A. Each element bonding layer 31A is, as shown in FIG. 13, interposed between the element reverse surface 102 of each semiconductor element 10A and the conductive member 22A, and makes the drain electrodes 113 of the semiconductor elements 10A conductive with the conductive member 22A. Each element bonding layer 31A has a thickness of about 30 to 100 μm. The thickness of each element bonding layer 31A is not limited thereto.

Each of the plurality of element bonding layers 31B is for bonding each semiconductor element 10B to the conductive member 22B. Each element bonding layer 31B is, as shown in FIG. 15, interposed between the element reverse surface 102 of each semiconductor element 10B and the conductive member 22B, and makes the drain electrodes 113 of the semiconductor elements 10B conductive with the conductive member 22B. Each element bonding layer 31B has a thickness of about 30 to 100 μm, similar to each element bonding layer 31A. The thickness of each element bonding layer 31B is not limited thereto. The element bonding layers 31A and 31B represent one example of a "second conductive bonding layer".

Each of the plurality of lead bonding layers 321 and 322 is for bonding each lead member 51.

Each of the plurality of lead bonding layers 321 is, as shown in FIGS. 11 to 13, for bonding the buffer members 81 bonded to the first bonding portion 511 of each lead member 51 to the source electrode 111 of the semiconductor element 10A. Each lead bonding layer 321 is interposed between the source electrode 111 of the semiconductor element 10A and the first bonding portion 511 of the lead member 51, and makes the source electrode 111 of the semiconductor element 10A conductive with the lead member 51. Each lead bonding layer 321 has a thickness of about 30 to 100 μm. The thickness of each lead bonding layer 321 is not limited thereto. The lead bonding layer 321 represents one example of a "conductive bonding layer".

Each of the plurality of lead bonding layers 322 is, as shown in FIG. 11, for bonding the second bonding portion 512 of each lead member 51 to the conductive member 22B. Each lead bonding layer 322 is interposed between the second bonding portion 512 of each lead member 51 and the conductive member 22B, and makes the lead members 51 conductive with the conductive member 22B. Each lead bonding layer 322 has a thickness of about 30 to 100 μm. The thickness of each lead bonding layer 322 is not limited thereto.

The plurality of terminal bonding layers 33 are, as shown in FIGS. 14 and 15, for bonding the buffer member 82 bonded to each protruding portion 421c of the input terminal 42 to the source electrode 111 of each semiconductor elements 10B. Each terminal bonding layer 33 is interposed between the source electrode 111 of the semiconductor element 10B and each protruding portion 421c of the input terminal 42, and makes the source electrodes 111 of the semiconductor elements 10B conductive with the input terminal 42. Each terminal bonding layer 33 has a thickness of about 30 to 100 μm. The thickness of each terminal bonding layer 33 is not limited thereto. The terminal bonding layer 33 represents one example of a "conductive bonding layer".

Each of the plurality of wires 6 is a so-called bonding wire. Each wire 6 has conductivity, and its constituent material is, for example, any of Al, Au, and Cu. In the present embodiment, the plurality of wires 6, as shown in FIGS. 4 and 5, include a plurality of gate wires 61, a plurality of detection wires 62, a pair of first connection wires 63, and a pair of second connection wires 64.

Each of the plurality of gate wires 61, as shown in FIGS. 4 and 5, has one end bonded to the gate electrode 112 of each semiconductor element 10, and the other end bonded to one of the pair of gate layers 24A and 24B. The plurality of gate wires 61 include those that make the gate electrode 112 of each semiconductor element 10A conductive with the gate layer 24A, and those that make the gate electrode 112 of each semiconductor element 10B conductive with the gate layer 24B.

Each of the plurality of detection wires 62, as shown in FIGS. 4 and 5, has one end bonded to the source electrode 111 of each semiconductor element 10, and the other end bonded to one of the pair of the detection layers 25A and 25B. The plurality of detection wires 62 include those that make the source electrode 111 of the semiconductor element 10A conductive with the detection layer 25A and those that make the source electrode 111 of the semiconductor element 10B conductive with the detection layer 25B.

The pair of the first connection wires 63, as shown in FIGS. 4 and 5, has one connecting the gate layer 24A and the gate terminal 44A, and the other connecting the gate layer 24B and the gate terminal 44B. One of the pair of the first connection wires 63 has one end bonded to the gate layer 24A and the other end bonded to the pad portion 441 of the gate terminal 44A, and makes the gate layer 24A conductive with the gate terminal 44A. The other of the pair of the first connection wires 63 has one end bonded to the gate layer 24B and the other end bonded to the pad portion 441 of the gate terminal 44B, and makes the gate layer 24B conductive with the gate terminal 44B.

The pair of the second connection wires 64, as shown in FIGS. 4 and 5, has one connecting the detection layer 25A and the detection terminal 45A, and the other connecting the detection layer 25B and the detection terminal 45B. One of the pair of the second connection wires 64 has one end bonded to the detection layer 25A and the other end bonded to the pad portion 451 of the detection terminal 45A, and makes the detection layer 25A conductive with the detection terminal 45A. The other of the pair of the second connection wires 64 has one end bonded to the detection layer 25B and the other end bonded to the pad portion 451 of the detection terminal 45B, and makes the detection layer conductive with the detection terminal 45B.

The sealing resin 7, as shown in FIGS. 1, 3, 4, and 6 to 10, covers the plurality of semiconductor elements 10, a part of the support substrate 20, the plurality of conductive bonding layers 3, a part of each terminal 40, the plurality of lead members 51, and the plurality of wires 6. The constituent material of the sealing resin 7 is, for example, an epoxy resin. The sealing resin 7, as shown in FIGS. 1, 3, 4, and 6 to 10, has a resin obverse surface 71, a resin reverse surface 72, and a plurality of resin side surfaces 731 to 734.

The resin obverse surface 71 and the resin reverse surface 72 are spaced apart in the z direction and face opposite each other. The resin obverse surface 71 faces the z2 side in the z direction, and the resin reverse surface 72 faces the z1 side in the z direction. The resin reverse surface 72, as shown in FIG. 7, has a frame shape surrounding the reverse surface 212 of the insulating substrate 21 as viewed in the z direction. The reverse surface 212 of the insulating substrate 21 is exposed from the resin reverse surface 72. Each of the plurality of resin side surfaces 731 to 734 is connected to both the resin obverse surface 71 and the resin reverse surface 72, and is sandwiched between the resin obverse surface 71 and the resin reverse surface 72 in the z direction. In the present embodiment, the resin side surfaces 731 and 732 are spaced apart in the x direction and face opposite each other. The resin side surface 731 faces the x2 side in the x direction, while the resin side surface 732 faces the x1 side in the x direction. The resin side surfaces 733 and 734 are spaced apart in the y direction and face opposite each other.

The resin side surface 733 faces the y2 side in the y direction, while the resin side surface 734 faces the y1 side in the y direction.

In the present embodiment, the sealing resin 7, as shown in FIGS. 6, 7, and 10, includes a plurality of recesses 75 each of which is recessed from the resin reverse surface 72 in the z direction. The sealing resin 7 may not include the recesses 75. Each of the plurality of recesses 75 extends in the y direction, and is connected from the edge in the y1 side to the edge in the y2 side in the y direction of the resin reverse surface 72 as viewed in the z direction. In the present embodiment, the plurality of recesses 75 are formed three each across the reverse surface 212 of the insulating substrate 21 along the x direction as viewed in the z direction.

Next, a method for manufacturing the semiconductor device A1 according to the first embodiment will be described.

First, the support substrate 20 is prepared. In the step of preparing the support substrate 20 (support substrate preparing step), the plurality of conductive members 22 (conductive members 22A and 22B) are bonded separately from each other onto the insulating substrate 21. Then, the pair of insulating layers 23A and 23B, the pair of gate layers 24A and 24B, the pair of detection layers 25A and 25B, and the plurality of base portions 29 are bonded on the conductive members 22A and 22B.

Next, the plurality of lead members 51 are prepared. In the step of preparing the lead members 51 (lead preparing step), lead members 51 are formed by metal processing, such as rolling, for a metal sheet, whose constituent material is Cu or Cu alloy. Next, the plated layer 515 are formed on each lead member 51. Then, each buffer member 81 having the plated layer 85 are bonded to the first bonding portion 511 of each lead members 51. The bonding is performed by the solid-phase diffusion bonding between the plated layer 85 (including Ag) formed on the obverse surface 801 of the buffer member 81 and the plated layer 515 (including Ag) formed on the first bonding portion 511.

Next, a plurality of sintering metallic materials 301A are formed. Each sintering metallic material 301 is a base of element bonding layers 31A and 31B. In the present embodiment, a paste-like silver is used as each sintering metallic material 301. The paste-like sintering silver is a mixture of micro-size or nano-size silver particles in a solvent. In the present embodiment, a solvent of the sintered silver does not contain (or hardly contains) an epoxy resin. In the step of forming the sintering metallic materials 301 (first sintering metallic material forming step), each sintering metallic material 301 is applied onto the conductive members 22A and 22B by, for example, screen printing using a mask. Each sintering metallic material 301 applied onto the conductive member 22A will become the element bonding layer 31A of the semiconductor device A1 later, and each sintering metallic material 301 applied onto the conductive member 22B will become the element bonding layers 31B of the semiconductor device A1 later. The method for forming the plurality of sintering metallic materials 301 is not limited to the screen printing described above. For example, the sintering metallic material 301 may be applied by a dispenser. The thickness of the applied sintering metallic material 301 is about 50 to 110 μm.

Next, a drying process is performed on the plurality of sintering metallic materials 301. In the step of performing the drying process (drying step), each sintering metallic material 301 are heated at a temperature of about 130° C. for about 20 minutes. The heating conditions are not limited thereto. Thereby, the solvent of each sintering metallic materials 301 is vaporized.

Next, either one semiconductor element 10A or one semiconductor element 10B is put on each of the plurality of sintering metallic materials 301. Specifically, one semiconductor element 10A is put on each of the plurality of sintering metallic materials 301 formed on the conductive member 22A, and one semiconductor element 10B is put on each of the plurality of sintering metallic materials 301 formed on the conductive member 22B. In the step of mounting the semiconductor elements 10A and 10B (mounting step), each semiconductor element is mounted on the conductive member 22A with the conductive member 22A and the element reverse surface 102 of the semiconductor element 10A facing each other. Further, each semiconductor element 10B is mounted on the conductive member 22B with the conductive member 22B and the element reverse surface 102 of the semiconductor element 10B facing each other.

Next, the sintering metallic materials 302 are formed on the source electrode 111 of each of the plurality of semiconductor elements 10A and 10B and the conductive members 22A and 22B respectively. Each of the sintering metallic materials 302 are base of the lead bonding layers 321 and 322 and a terminal bonding layers 33. In the present embodiment, a sintered silver in the form of a preform is used as each sintering metallic materials 302. The preformed sintered silver is, for example, formed into a predetermined shape after drying the above-described paste-like sintering silver. The preformed sintered silver may be processed to a drying treatment after being formed into a predetermined shape. In the step of forming the sintering metallic materials 302 (second sintering metallic material forming step), the plurality of sintering metallic materials 302 are placed one by one on the source electrode 111 of each of the semiconductor elements 10A and 10B and on the conductive member 22B respectively. The sintering metallic material 302 formed on the source electrode 111 of the semiconductor element 10A will become the lead bonding layer 321 of the semiconductor device A1 later, and the sintering metallic material 302 formed on the conductive member 22B will become the lead bonding layer 322 of the semiconductor device A1 later. Further, the sintering metallic material 302 formed on the source electrode 111 of the semiconductor element 10B will become the terminal bonding layer 33 of the semiconductor device A1 later. The thickness of the applied sintering metallic material 302 is about 50 to 110 μm.

Next, each semiconductor element 10A is connected to the conductive member 22B by using a lead member 51, prepared at the lead preparing step, to each of which the buffer member 81 is bonded at the first bonding portion 511. In this step (connecting step) using the lead member 51 for connection, the lead member 51 is arranged so that the first bonding portion 511 and the buffer member 81 overlap with the sintering metallic material 302 formed on the source electrode 111 of the semiconductor element 10A as viewed in the z direction, and so that the second bonding portion 512 overlaps with the sintering metallic material 302 formed on the conductive member 22B as viewed in the z direction.

Next, the plurality of terminals 40 are bonded. In bonding the input terminal 41, the comb teeth portions 411a are bonded to the obverse surface 221A of the conductive member 22A. The bonding may be performed by laser welding or ultrasonic bonding. In bonding the output terminal 43, the comb teeth portions 431a are bonded to the obverse surface 221B of the conductive member 22B. The bonding may be performed by laser welding or ultrasonic bonding. In bonding the input terminal 42, the input terminal 41 and the block electrode 48 are bonded with the insulating member 49 interposed therebetween. The pair of gate terminals 44A and 44B, the pair of detection terminals 45A and 45B, the plurality of dummy terminals 46, and the pair of side terminals 47A and 47B are formed on one lead frame so as to be connected to each other. Then, portions of the lead frame corresponding to the side terminals 47A and 47B are bonded to the obverse surface 221A of the conductive member 22A and the obverse surface 221B of the conductive member 22B, respectively. The bonding may be performed by laser welding or ultrasonic bonding.

Next, the input terminal 42 is connected to each semiconductor element 10B. Each protruding portion 421c of the input terminal 42 has the plated layer 421d, and the buffer member 82 are bonded thereto. The bonding between the protruding portion 421c and the buffer member 82 is performed by the solid-phase diffusion bonding between the plated layer 85 (including Ag) formed on the obverse surface 801 of each buffer member 82 and the plated layer 421d (including Ag) formed on each protruding portion 421c. The input terminal 42 is put onto the input terminal 41 with the insulating member 49 interposed therebetween. At this time, the input terminal 42 is put so that the plurality of the protruding portions 421c and the buffer members 81 each overlap with the sintering metallic materials 302 formed on the source electrode 111 of each semiconductor element 10B.

Next, a pressurizing and heating process is performed to convert each of the sintering metallic materials 301 and 302 into sintered metals. In the step of performing the pressurizing and heating process (pressurizing and heating step), the pressing force is, as shown in FIGS. 16A and 16B, applied on the plurality of sintering metallic materials 301 and 302 by pressing each lead member 51 with the pressing member 90. At this time, some of the buffer members 81 may transform to make the position in the z direction of an upper surface of each lead member 51 the same levels (FIG. 16B). As a result, the load applied on each semiconductor element 10A is equalized. The pressing member 90 or a different pressing member other than the pressing member 90 may simultaneously press against the input terminal 42, so that the pressing force is applied on the plurality of sintering metallic materials 301 and 302. At this time, some of the buffer members 82 may transform to make the position in the z direction of an upper surface (the surface facing opposite each other of the semiconductor element 10B) of each protruding portion 421c of the input terminal 42 the same levels. As a result, the load applied on each semiconductor element 10B is equalized. Then, the sintering metallic materials 301 and 302 pressed via the lead members 51 and the sintering metallic materials 301 and 302 pressed via the input terminal 42 are heated at a temperature of, for example, about 250° C. for about 90 seconds. The heating conditions are not limited thereto. As a result, in each of the plurality of sintering metallic materials 301 and 302, the silver particles are bonded with each other to form sintered metals. The sintered metals between the semiconductor elements 10A and the conductive member 22A correspond to the element bonding layers 31A of the semiconductor device A1, and the sintered metals between the semiconductor elements 10B and the conductive member 22B correspond to the element bonding layers 31B of the semiconductor device A1. The sintered metals between the first bonding portions 511 of the lead members 51 and the semiconductor elements 10A correspond to the lead bonding layers 321 of the semiconductor device A1. The sintered metals between the second bonding portions 512 of the lead members 51 and the conductive member 22B correspond to the lead bonding layers 322 of the semiconductor device A1. The sintered metals between the protruding portions 421c of the input terminal 42 and the semiconductor elements 10B correspond to the terminal bonding layers 33 of the semiconductor device A1.

Next, the plurality of wires 6 are formed. In the step of forming the wires 6 (wire forming step), for example, a known wire bonder is used. In the wire forming step, the plurality of gate wires 61 are formed each connecting the gate electrode 112 of each semiconductor element 10A and the gate layer 24A, and a plurality of gate wires 61 are formed each connecting the gate electrode 112 of each semiconductor element 10B and the gate layer 24B. Further, a plurality of detection wires 62 each connecting the source electrode 111 of the semiconductor element 10A and the detection layer 25A and a plurality of detection wires 62 each connecting the source electrode 111 of the semiconductor element 10B and the detection layer 25B are formed. Further, the first connection wires 63 each connecting the gate layer 24A and the gate terminal 44A and the first connection wires 63 each connecting the gate layer 24B and the gate terminal 44B are formed. Then, the second connection wires 64 each connecting the detection layer 25A and the detection terminal 45A and the second connection wires 64 each connecting the detection layer 25B and the detection terminal 45B are formed. The order of forming the plurality of wires 6 is not particularly limited.

Next, the sealing resin 7 is formed. In the step of forming the sealing resin 7 (resin forming step), for example, transfer molding is performed. The sealing resin 7 is, for example, an epoxy resin. In the present embodiment, the sealing resin 7 is formed to cover the plurality of semiconductor elements 10, a part of the support substrate 20, the plurality of conductive bonding layers 3, a part of the plurality of terminals 40, the plurality of lead members 51 and the plurality of wires 6. From the formed sealing resin 7, a part of each terminal 40 and a part of the support substrate 20 (specifically, the reverse surface 212 of the insulating substrate 21) are exposed.

Thereafter, unnecessary portions of the plurality of terminals 40 (for example, a part of the lead frame) are cut or the plurality of terminals 40 get bent, whereby the semiconductor device A1 shown in FIGS. 1 to 15 is obtained. Note that the above manufacturing method is an example, and the present invention is not limited thereto and the order may be replaced as appropriate.

Next, the operation and effect of the semiconductor device A1 will be described.

According to the present embodiment, the buffer member 81 is interposed between the first bonding portion 511 of each lead member 51 and the source electrode 111 of each semiconductor element 10A, respectively. The buffer members 81 includes Al and has a Vickers hardness lower than a Vickers hardness of the lead member 51 including Cu. Some of the buffer members 81 are pressed and thinned by the pressure when the pressing member 90 presses each lead member 51 during the pressurization and heating process, thereby the position in the z direction of an upper surface of each lead member 51 (the distance between the obverse surface 221A of the conductive member 22A and the upper surface of each lead member 51) is about the same level. This equalizes the load applied on each semiconductor element 10A, thereby eliminating the uneven load applied on some of the semiconductor elements 10A. According to the present embodiment, the buffer member 82 is also interposed between each protruding portion 421c of the input terminal 42 and the source electrode 111 of the semiconductor element 10B respectively. The buffer member 82 includes Al and has a Vickers hardness lower than a Vickers hardness of the input terminal 42 including Cu. Some of the buffer members 82 are pressed and thinned by the pressure when the pressing member 90 presses the input terminal 42 during the pressurization and heating process, thereby the position in the z direction of an upper surface of each protruding portion 421c (the distance between the obverse surface 221B of the conductive member 22B and the upper surface of each protruding portions 421c) is about the same level. This equalizes the load applied on each semiconductor element 10B, thereby eliminating the uneven load applied on some of the semiconductor elements 10B.

According to the present embodiment, the plated layers 85 including Ag are formed on all surfaces of the obverse surface 801 and the reverse surface 802 of each buffer member 8. Further, the plated layer 515 including Ag is formed on the first bonding portion 511 of each lead member 51, and the plated layer 421d including Ag is formed on each protruding portion 421c of the input terminal 42. Thus, each buffer member 8 is capable of being bonded to the first bonding portion 511 of the lead member 51 or the protruding portion 421c of the input terminal 42 by Ag solid phase diffusion bonding. The source electrode 111 of each semiconductor elements 10 has the plated layer 515 with an outermost layer laminated by a layer of Au. This enables each buffer member 8 to be firmly bonded to the source electrode 111 of each semiconductor element 10 with the conductive bonding layer 3 made of a sintered silver. Each buffer member 8 is also capable of being firmly bonded to the first bonding portion 511 or the protruding portion 421c with the conductive bonding layer 3.

According to the present embodiment, the sintering metallic material 301 that is formed under each semiconductor element 10A and the sintering metallic material 302 that is formed on each semiconductor element 10A are simultaneously processed for pressurizing and heating. That is, the element bonding layers 31A and the lead bonding layers 321 are sintered simultaneously. The sintering metallic materials 301 and 302 are formed into element bonding layers 31A and the lead bonding layers 321 with a single pressurizing and heating process, thereby improving the productivity of the semiconductor device A1. According to the present embodiment, the sintering metallic material 301 that is formed under each semiconductor element 10B and the sintering metallic material 302 that is formed on each semiconductor element 10B are simultaneously processed for pressurizing and heating. That is, the element bonding layers 31B and the terminal bonding layers 33 are sintered simultaneously. The sintering metallic materials 301 and 302 are formed into the element bonding layers 31B and the terminal bonding layers 33 with a single pressurizing and heating process, thereby improving the productivity of the semiconductor device A1.

According to the present embodiment, each of the element bonding layers 31A and 31B are formed from the sintering metallic material 301 that is a paste-like sintering silver. The paste-like sintering silver is cheaper than a preformed sintered silver. Therefore, the semiconductor device A1 is capable of cutting the manufacturing cost. In the present embodiment, each of the element bonding layers 31A and 31B may be formed from the preformed sintered silver. That is, the preformed sintered silvers may be used as the sintering metallic material 301. In the above case, the process of drying the paste-like sintering silver is not required, thereby improving the productivity of the semiconductor device A1.

The present embodiment above describes the case where the sintering metallic materials 301 formed under each semiconductor element 10 and the sintering metallic materials 302 formed on each semiconductor element 10 are simultaneously processed for pressurizing and heating, but the disclosure is not limited thereto. The sintering metallic materials 301 formed under each semiconductor element 10 and the sintering metallic materials 302 formed on each semiconductor element 10 may be separately processed for pressurizing and heating.

The present embodiment describes the case that the conductive bonding layer 3 includes the sintered metal, but is not limited thereto. The conductive bonding layer 3 may be, for example, a silver paste.

FIGS. 17 to 28B show other embodiments. In these figures, the same or similar elements as those of the above embodiment are denoted by the same reference signs.

Figure 17:
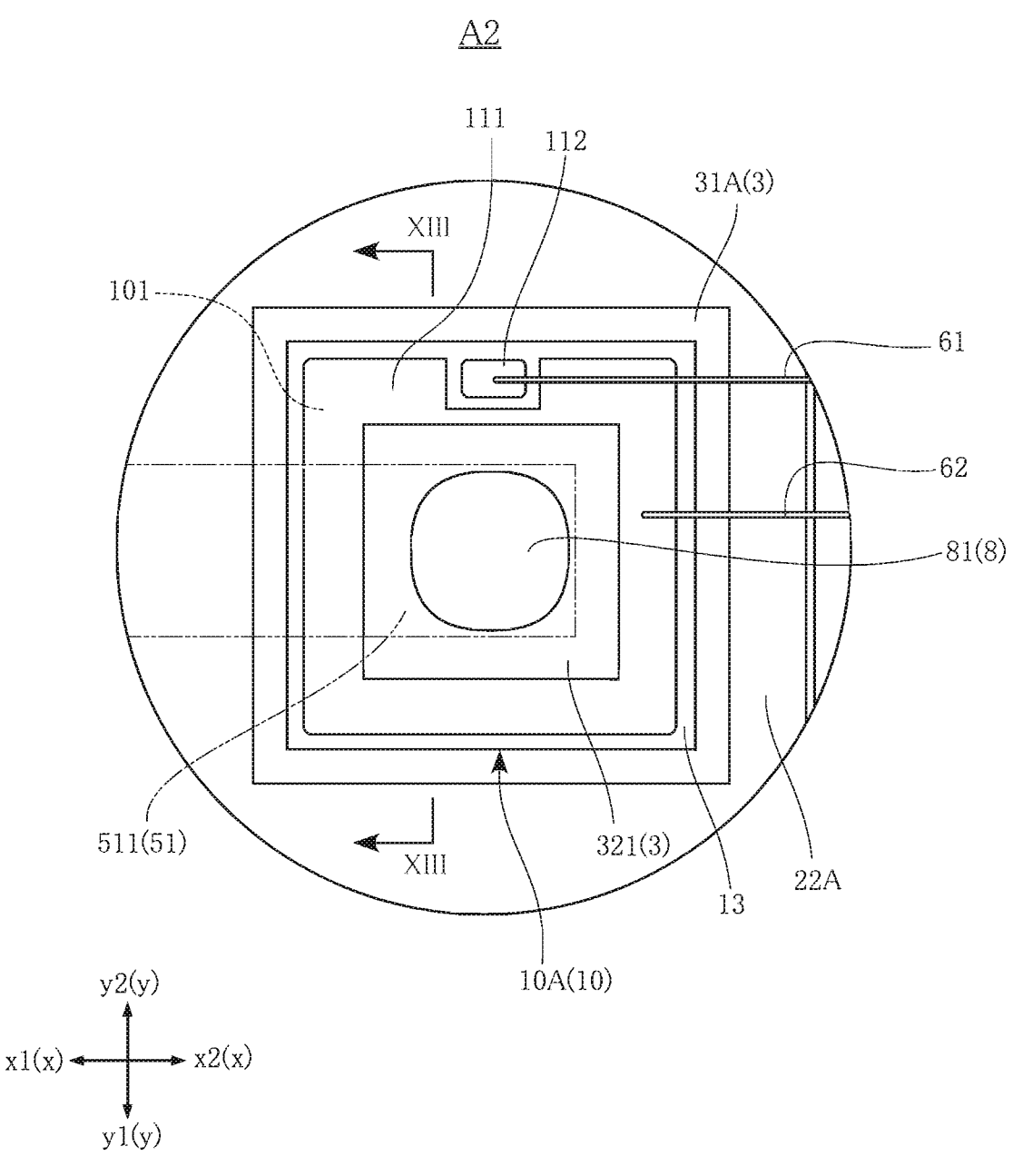
FIG. 17 is a partially enlarged plan view of a semiconductor device according to a second embodiment of the present disclosure.
Figure 18:
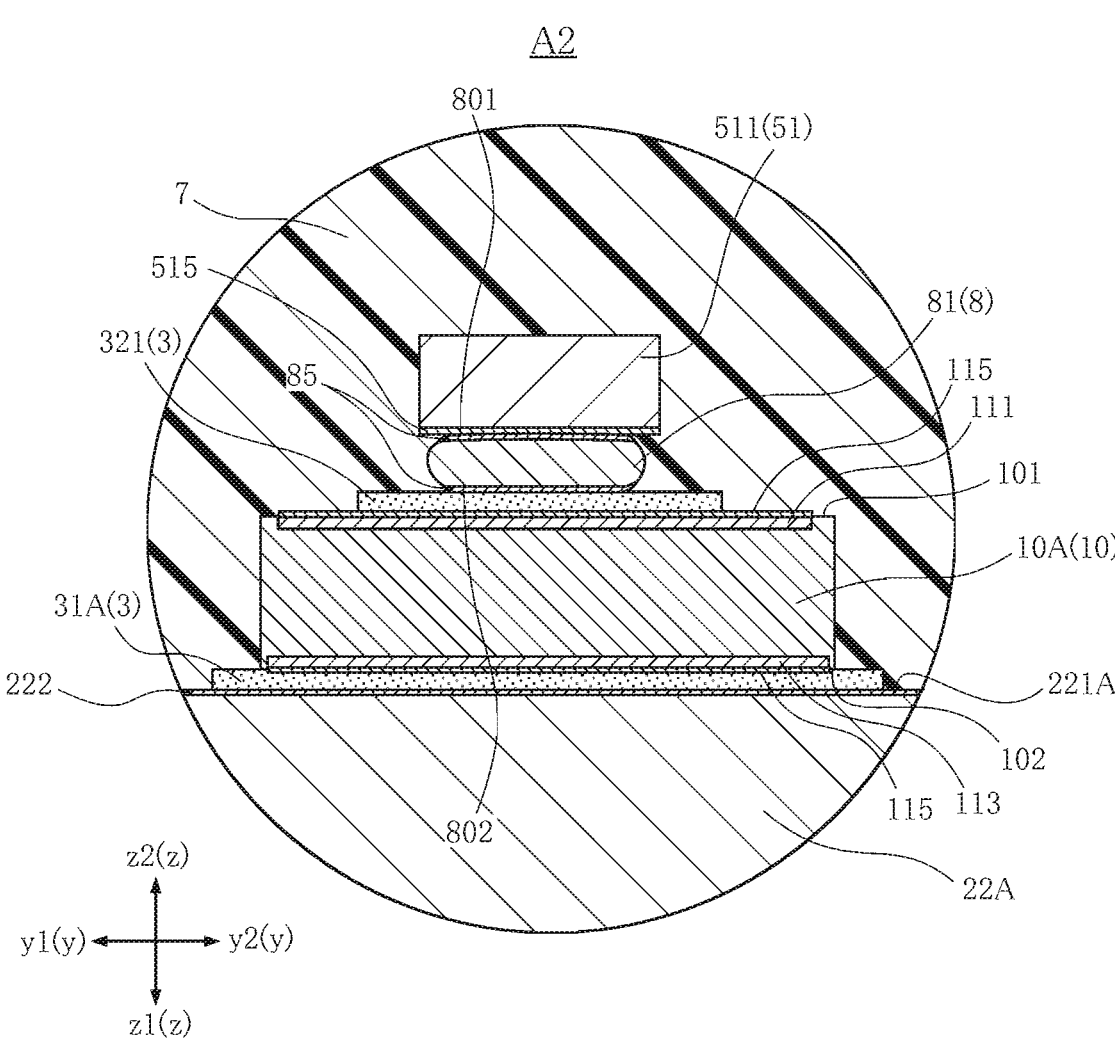
FIG. 18 is a partially enlarged cross-sectional view of a semiconductor device shown in FIG. 17.

FIGS. 17 and 18 show a semiconductor device A2 according to a second embodiment of the present disclosure. FIG. 17 is a partially enlarged plan view of the semiconductor device A2, which corresponds to FIG. 12. Note that the lead member 51 is indicated by imaginary lines (dash-double dot lines) in FIG. 17. FIG. 18 is a partially enlarged cross-sectional view of the semiconductor device A2, which corresponds to FIG. 13. The semiconductor device A2 according to the present embodiment differs from the semiconductor device A1 in that the size of buffer members 8 is lower as viewed in the z direction.

The size of the buffer member 8 according to the second embodiment is smaller as viewed in the z direction, compared to that of the semiconductor device A1 according to the first embodiment. Before and even after transformation, each buffer member 8 has a size small enough to be encompassed by the first bonding portion 511 of each lead member 51 or each protruding portion 421c of the input terminal 42 as viewed in the z direction. Each buffer member 8 has a bulge with an outer line curvilinear due to the press-fit as viewed in the z direction similar to the first embodiment. Further, the cross-section, as shown in FIG. 17, has an outwardly protruding shape with both ends arcuate in the directions orthogonal to the z direction. However, the buffer member 8 each does not protrude beyond the first bonding portion 511 or the protruding portion 421c as viewed in the z direction, and does not have a portion corresponding to the second portion 81b (82b) of the first embodiment.

The present embodiment also has the buffer members 81 that are interposed between the first bonding portion 511 of each lead members 51 and the source electrode 111 of each semiconductor elements 10A, respectively. This eliminates the uneven load applied on some of the semiconductor elements 10A. The buffer members 82 are also interposed between each protruding portion 421c of the input terminal 42 and the source electrodes 111 of each semiconductor element 10B, respectively. This eliminates the uneven load applied on some of the semiconductor elements 10B. The semiconductor device A2 has a configuration in common with the semiconductor device A1, thereby achieving the same effect as the semiconductor device A1.

Figure 19:
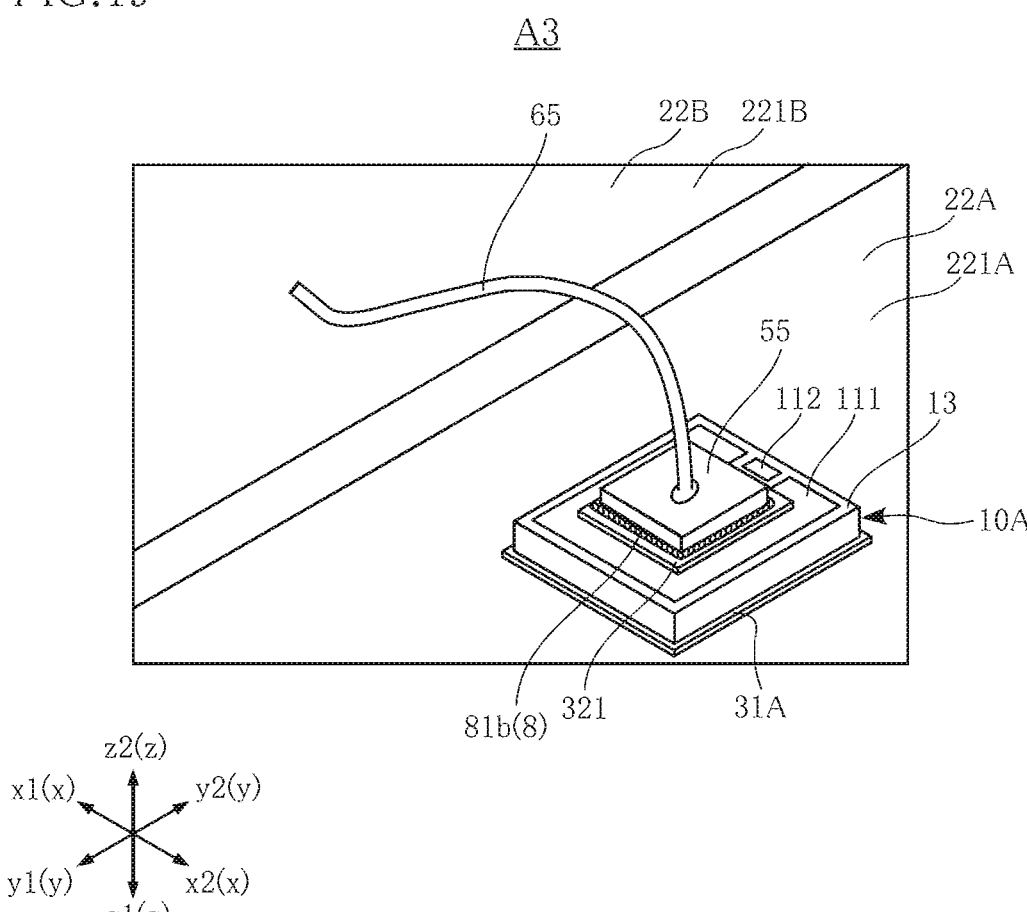
FIG. 19 is a partially enlarged perspective view of a semiconductor device according to a third embodiment of the present disclosure.
Figure 20:
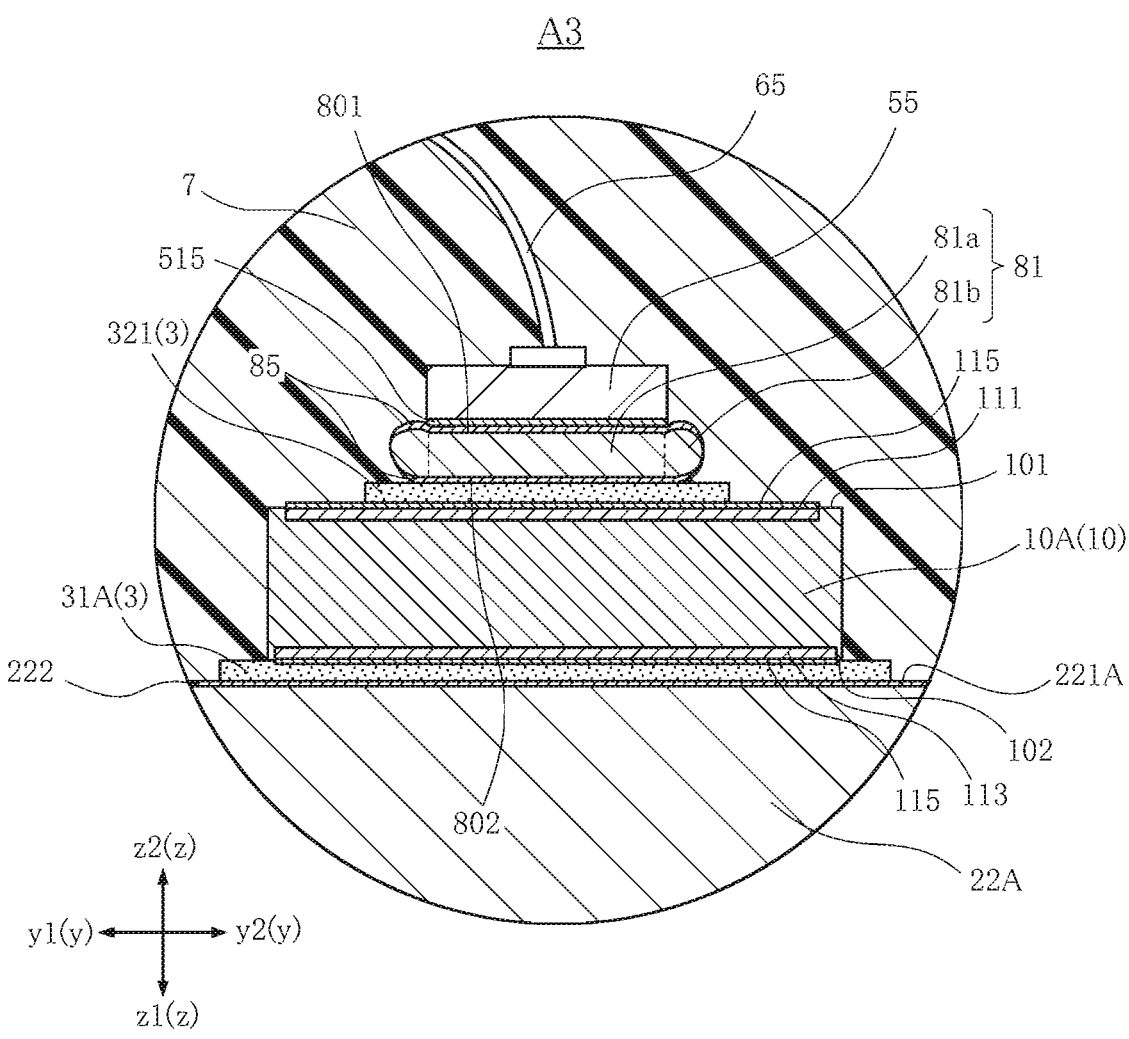
FIG. 20 is a partially enlarged cross-sectional view of a semiconductor device shown in FIG. 19.

FIGS. 19 and 20 show a semiconductor device A3 according to a third embodiment of the present disclosure. FIG. 19 is a partially enlarged perspective view of the semiconductor device A3, which corresponds to FIG. 11. In FIG. 19, the gate wires 61 and the detection wires 62 are omitted. FIG. 20 is a partially enlarged cross-sectional view of the semiconductor device A3, which corresponds to FIG. 13. The semiconductor device A3 according to the present embodiment differs from the semiconductor device A1 according to the first embodiment in including a source wire 65 instead of each lead member 51.

The semiconductor device A3 according to the third embodiment does not include the plurality of lead members 51 but further includes the plurality of source wires 65 and the plurality of plate members 55. In the semiconductor device A3, the source electrode 111 of each semiconductor element 10A and the conductive member 22B are electrically connected via the source wire 65 instead of the lead member 51.

Each source wire 65 is a so-called bonding wire. Each source wire 65 makes the source electrodes 111 of the semiconductor elements 10A conductive with the conductive member 22B. Each source wire 65, for example, includes Cu to withstand from large currents. Each source wire 65 has one end bonded to the plate members 55 conductive to the source electrode 111 of each semiconductor element 10A and the other end bonded to the conductive member 22B.

Each plate member 55 has a role as a buffer material to protect the source electrode 111 of each semiconductor element from impact when bonding the source wires 65, and is, for example, plate members including Cu. Each plate member 55 has a rectangular shape and overlaps with the source electrode 111 of each semiconductor element 10A as viewed in the z direction. In the present embodiment, the surface of each plate member 55 facing each semiconductor element 10A has the plated layer 515 thereon. The plated layer 515, for example, includes Ag, which is similar to the first embodiment. The constituent material of the plated layer 515 is not limited. In the present embodiment, the length of the z direction (the thickness) of the plate members 55 is about 100 to 200 μm. The thickness of the plate member 55 is not limited thereto. The buffer members 81 are each interposed between the source electrode 111 of each semiconductor element and the plated member 55, which is similar to the first embodiment. Some of the buffer members 81 transform when the pressing member 90 presses against each plated member 55 during the pressurization and heating process. In the present embodiment, the plate member 55 represents one example of a "first connecting member" or a "second connecting member".

According to the present embodiment, the buffer member 81 is interposed between the source electrode 111 of the semiconductor element 10A and the plate member 55. This eliminates the uneven load applied on some of the semiconductor elements 10A. Further, the buffer member 82 is interposed between the protruding portion 421c of the input terminal 42 and the source electrode 111 of the semiconductor element 10B. This eliminates the uneven load applied on some of the semiconductor elements 10B. The semiconductor device A3 has a configuration in common with the semiconductor device A1, thereby achieving the same effect as the semiconductor device A1.

Figure 21:
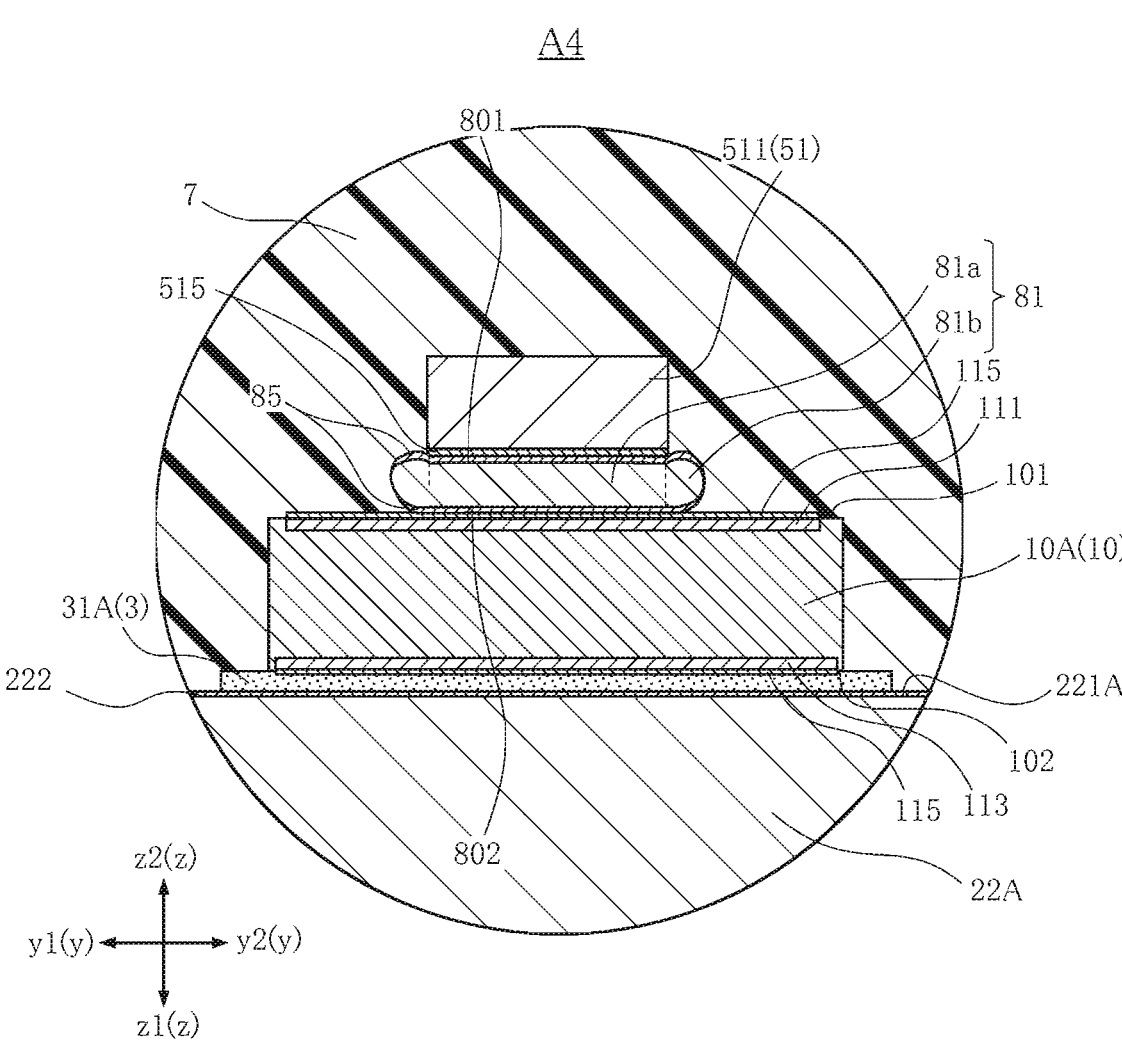
FIG. 21 is a partially enlarged cross-sectional view of a semiconductor device according to a fourth embodiment of the present disclosure.

FIG. 21 is a partially enlarged cross-sectional view of a semiconductor device A4 according to a fourth embodiment of the present disclosure, which corresponds to FIG. 13. The semiconductor device A4 according to the present embodiment differs from the semiconductor device A1 according to the first embodiment in not including the lead bonding layer 321 and the terminal bonding layers 33.

The plated layer 85, which is formed on the buffer member 8 according to the fourth embodiment, includes Au. In addition, the plated layer 515, which is formed on the first bonding portion 511 of the lead member 51 and each protruding portion 421*c* of the input terminal 42, includes Au. The buffer member 81 and the first bonding portion 511 of the lead member 51 are bonded by solid phase diffusion bonding between the plated layer 85 (including Au) and the plated layer 515 (including Au), respectively. The buffer member 82 and each protruding portion 421*c* of the input terminal 42 are bonded by solid phase diffusion bonding between the plated layer 85 (including Au) and the plated layers 421*d* (including Au), respectively.

The buffer members 81, which is bonded to the first bonding portion 511 of the lead member 51, and the source electrode 111 of the semiconductor element 10A are bonded by solid phase diffusion bonding between the plated layer 85 (including Au) and the plated layer 115 (whose outermost layer include Au). The buffer member 82, which is bonded to the protruding portion 421*c* of the input terminal 42, and the source electrode 111 of the semiconductor element 10B are bonded by solid phase diffusion bonding between the plated layer 85 (including Au) and the plated layer 115 (whose outermost layer include Au).

In the present embodiment, the buffer member 81 is interposed between the first bonding portion 511 of the lead member 51 and the source electrode 111 of the semiconductor element 10A. This eliminates the uneven load applied on some of the semiconductor elements 10A. Further, the buffer member 82 is interposed between the protruding portion 421*c* of the input terminal 42 and the source electrode 111 of the semiconductor element 10B. This eliminates the uneven load applied on some of the semiconductor elements 10B. The semiconductor device A4 has a configuration in common with the semiconductor device A1, thereby achieving the same effect as the semiconductor device A1. In the semiconductor device A4, the buffer member 8 is bonded to the source electrode 111 of the semiconductor element 10 by solid phase diffusion bonding between the plated layer 85 (including Au) and the plated layer 115 (whose outermost layer includes Au). Therefore, the lead bonding layer 321 and the terminal bonding layer 33 are not required.

The present embodiment describes the case that the outermost layer of the plated layer 115, the plated layer 515, the plated layer 421*d*, and the plated layer 85 include Au, but is not limited thereto. The outermost layer of the plated layer 115, the plated layer 515, the plated layer 421*d*, and the plated layer 85 may include Ag. In the above case, the bonding is achieved by solid-phase diffusion bonding between each Ag.

Figure 22:
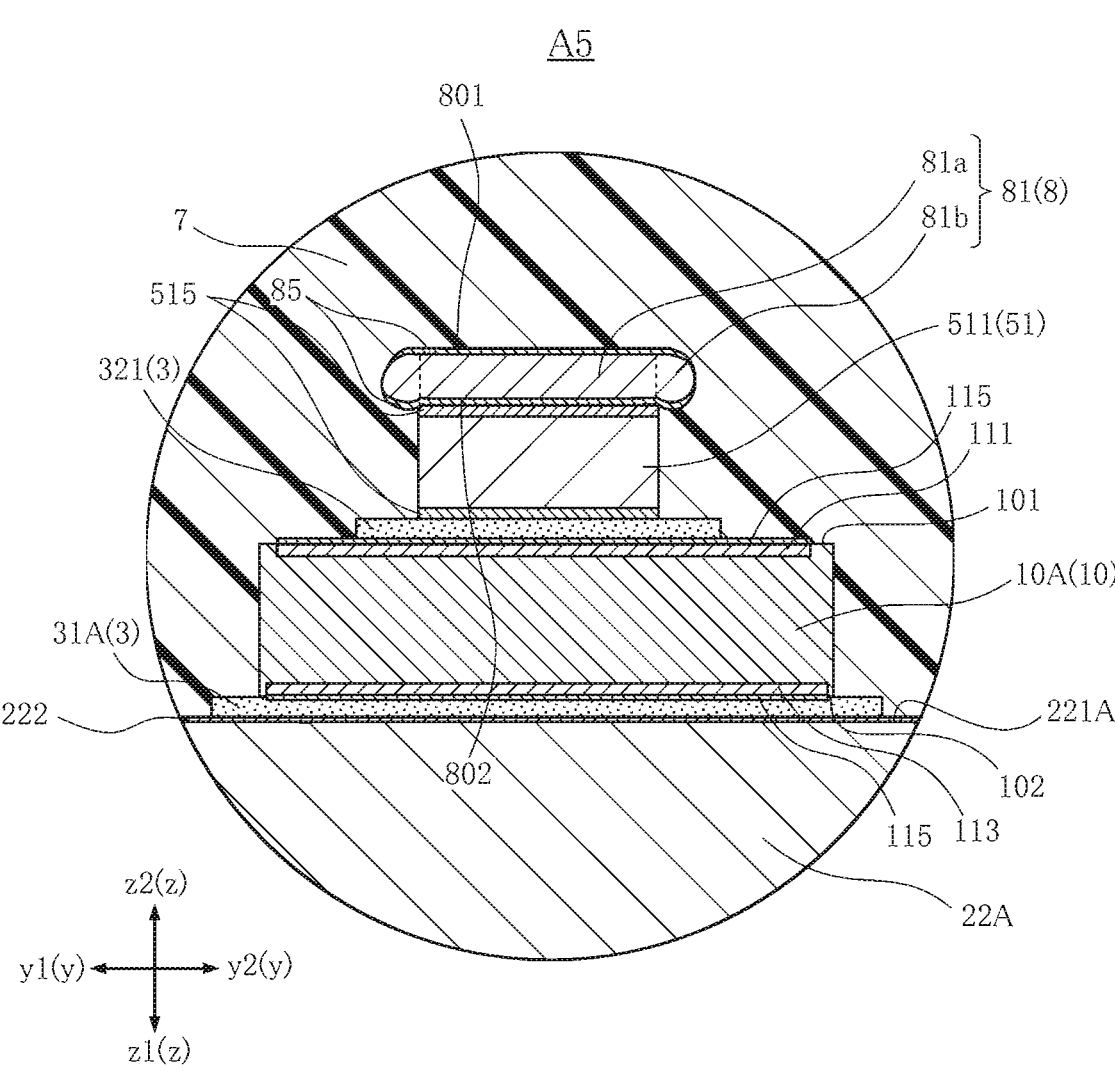
FIG. 22 is a partially enlarged cross-sectional view of a semiconductor device according to a fifth embodiment of the present disclosure.

FIG. 22 is a partially enlarged cross-sectional view of a semiconductor device A5 according to a fifth embodiment of the present disclosure, which corresponds to FIG. 13. The semiconductor device A5 according to the present embodiment differs from the semiconductor device A1 according to the first embodiment in the position of the buffer member 81.

In the semiconductor device A5 according to the fifth embodiment, the buffer member 81 is disposed on the opposite side of the semiconductor element 10A (the z2 side in the z direction) relative to the first bonding portion 511 of the lead member 51. Further, the first bonding portion 511 of the lead member 51 is bonded to the source electrode 111 of the semiconductor element via the lead bonding layer 321. The buffer member 82 may also be located on the opposite side of the semiconductor element 10B (the z2 side in the z direction) relative to the protruding portion 421*c* of the input terminal 42.

According to the present embodiment, the buffer member 81 is disposed on the z2 side in the z direction of the first bonding portion 511 of the lead member 51. Some of the buffer members 81 are pressed and thinned by the pressure when the pressing member presses the buffer members 81 bonded to the lead members 51 during the pressurization and heating process, thereby the position in the z direction (the distance between the obverse surface 221A of the conductive member 22A and the upper surface of each buffer member 81) of an upper surface of each buffer member 81 (the surface facing the opposite side of each semiconductor element 10A) is about the same level. This equalizes the load applied on each semiconductor element 10A, thereby eliminating the uneven load applied on some of the semiconductor elements 10A. The semiconductor device A5 has a configuration in common with the semiconductor device A1, thereby achieving the same effect as the semiconductor device A1.

Figure 23:
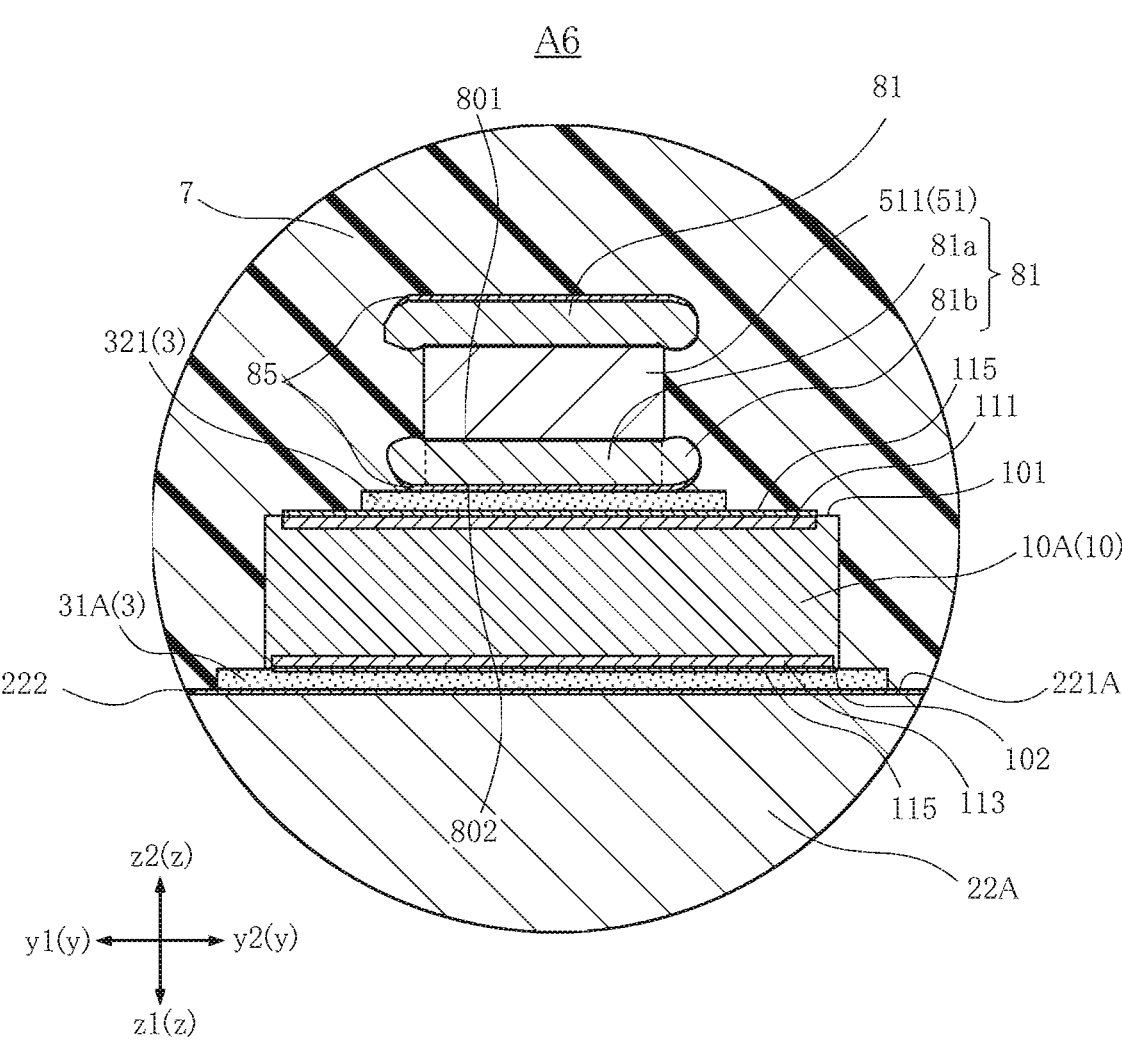
FIG. 23 is a partially enlarged cross-sectional view of a semiconductor device according to a sixth embodiment of the present disclosure.

FIG. 23 is a partially enlarged cross-sectional view of a semiconductor device A6 according to a sixth embodiment of the present disclosure, which corresponds to FIG. 13. The semiconductor device A6 according to the present embodiment differs from the semiconductor device A1 according to the first embodiment in that the buffer members 81 are disposed on both sides in the z direction of the first bonding portion 511 of the lead member 51.

In the semiconductor device A6 according to the sixth embodiment, the buffer members 81 are disposed on both sides in the z direction of the first bonding portion 511 of the lead member 51. In the present embodiment, a clad material is used for the lead member, and the clad material has a plate member including Cu with plate members including Al attached to both sides. The plate member including Cu corresponds to the lead member 51 and each of the plate members including Al correspond to the buffer members 81. Both surfaces of the clad material (corresponding to the outer surface of each buffer member 81) have the plated layers 85. The buffer members 82 may similarly be disposed on both sides in the z direction of the protruding portion 421*c* of the input terminal 42.

According to the present embodiment, the buffer members 81 are disposed on both sides in the z direction of the first bonding portion 511 of the lead member 51. Some of the buffer members 81 are pressed and thinned by the pressure when the pressing member presses the buffer members 81 bonded to the surface of each lead member 51 on the z2 side in the z direction (hereafter referred to as an "upper buffer members 81") during the pressurization and heating process, and the position in the z direction (the distance between the obverse surface 221A of the conductive member 22A, and the upper surface of each of the upper buffer members 81) of an upper surface of each of the upper buffer members 81 (the surface facing the opposite side of the semiconductor element 10A) is about the same level. This equalizes the load applied on each semiconductor element 10A, thereby eliminating the uneven load applied on some of the semiconductor elements 10A. The semiconductor device A6 has a configuration in common with the semiconductor device A1, thereby achieving the same effect as the semiconductor device A1.

Figure 24:
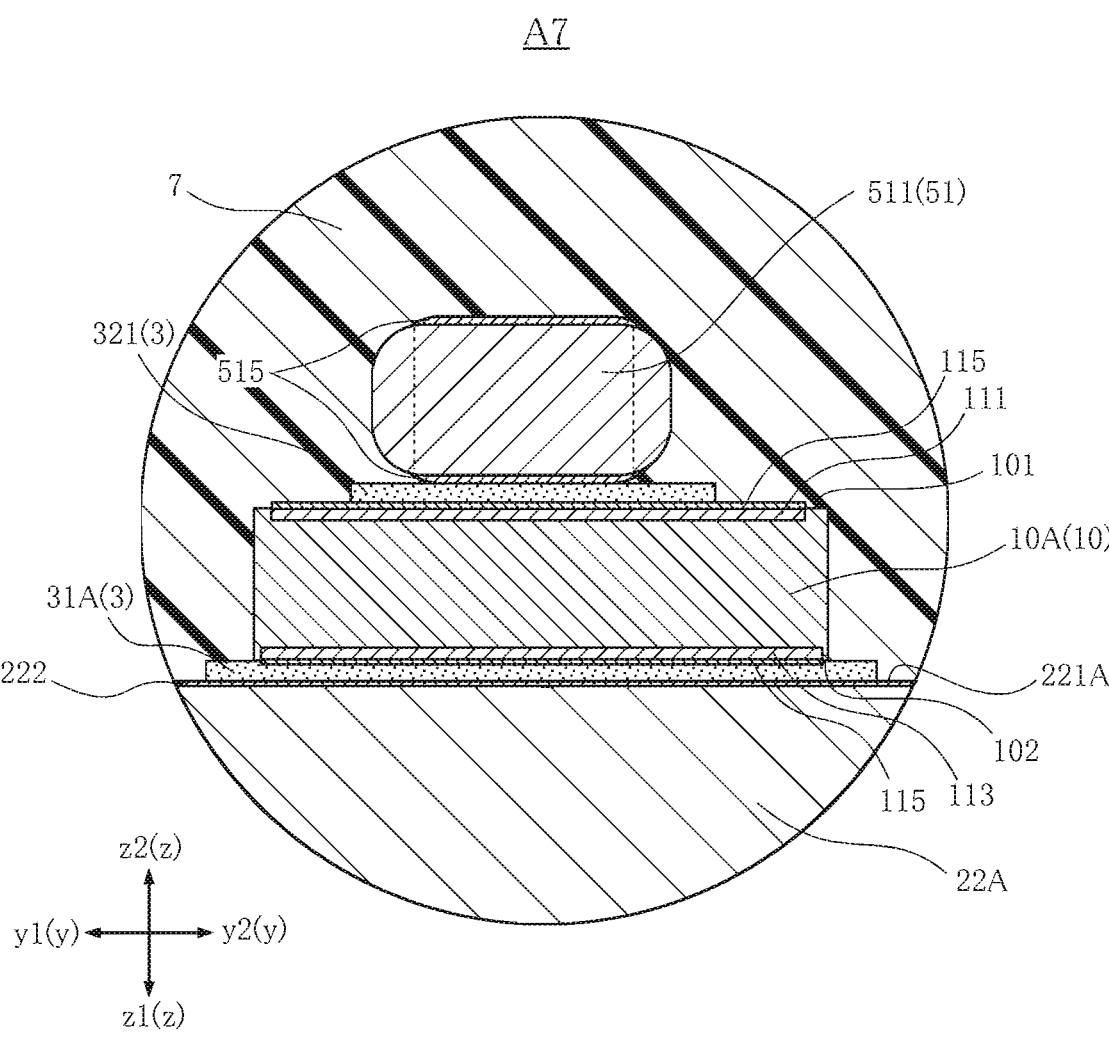
FIG. 24 is a partially enlarged cross-sectional view of a semiconductor device according to a seventh embodiment of the present disclosure.

FIG. 24 is a partially enlarged cross-sectional view of a semiconductor device A7 according to a seventh embodiment of the present disclosure, which corresponds to FIG. 13. The semiconductor device A7 according to the present embodiment differs from the semiconductor device A1 according to the first embodiment in the material of the lead member 51.

The semiconductor device A7 according to the seventh embodiment does not include the buffer members 81 but the lead members 51 functions as the buffer members. Each lead member 51 according to the seventh embodiment have a Vickers hardness lower than Cu and includes a conductive material, such as Al. The surface of the first bonding portion 511 of the lead member 51 facing the semiconductor element 10A has the plated layer 515 (including Ag) thereon, which is similar to the first embodiment. The first bonding portion 511 of the lead member 51 and the source electrode 111 of the semiconductor element 10A are bonded with the lead bonding layer 321. Some of the first bonding portions 511 of the lead members 51 transform during the pressurization and heating process, resulting in a shape having a bulge with an outer line curvilinear due to the press-fit as viewed in the z direction. The cross-section, as shown in FIG. 24, has an outwardly protruding shape with both ends arcuate in the directions orthogonal to the z direction. In the present embodiment, the lead member 51 represents one example of a "first connecting member". Similarly, the input terminal 41 includes Al, for example.

According to the present embodiment, each lead member 51 includes Al whose Vickers hardness is lower than the Vickers hardness of Cu. Some of the lead members 51 are pressed and thinned by the pressure when the pressing member 90 presses each lead member 51 during the pressurization and heating process, and the position in the z direction (the distance between the obverse surface 221A of the conductive member 22A and the upper surface of each first bonding portion 511) of an upper surface of each first bonding portion 511 (the surface facing the opposite side of the semiconductor element 10A) is about the same level. This equalizes the load applied on each semiconductor element 10A, thereby eliminating the uneven load applied on some of the semiconductor elements 10A. The semiconductor device A7 has a configuration in common with the semiconductor device A1, thereby achieving the same effect as the semiconductor device A1.

Figure 25:
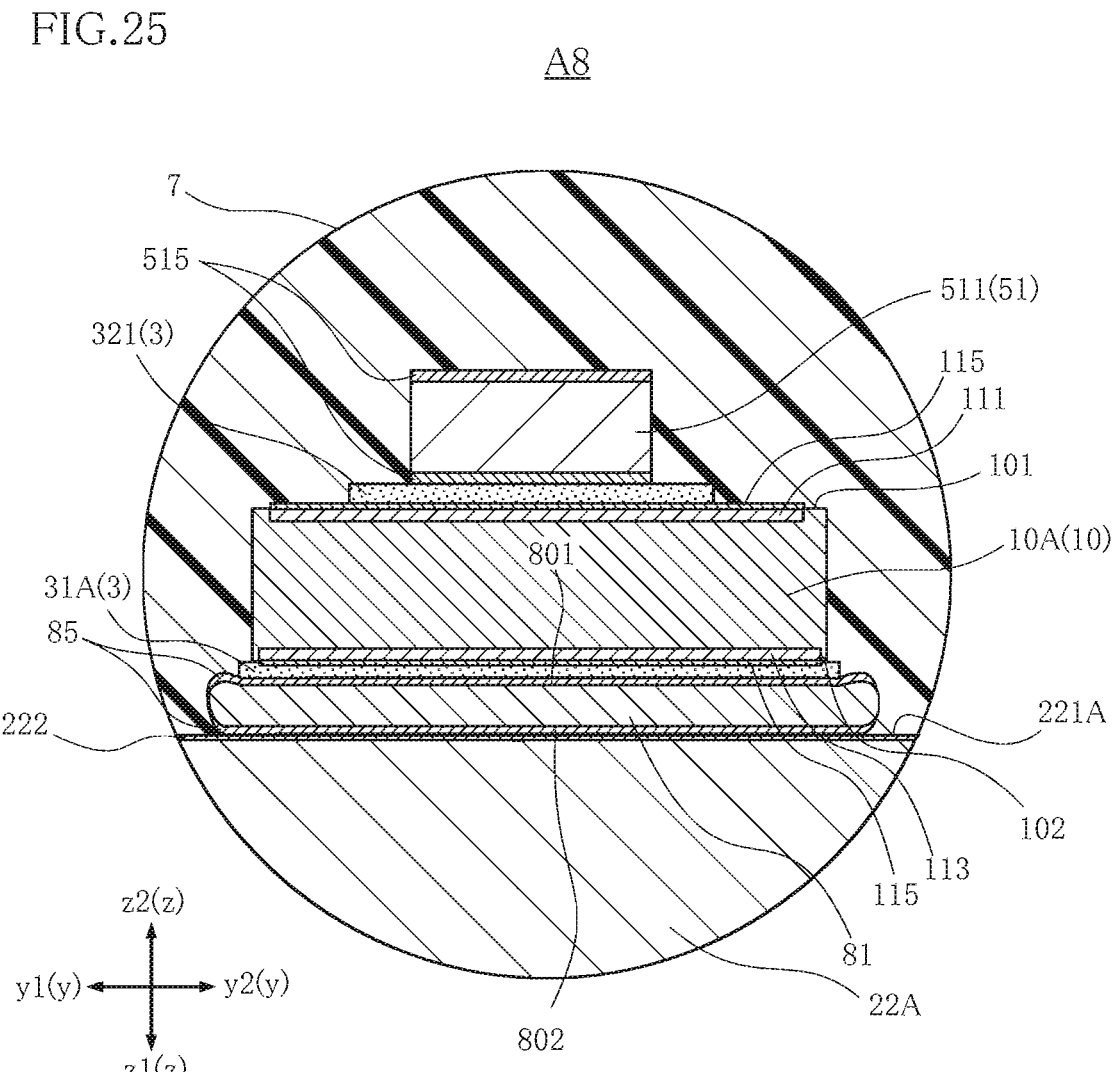
FIG. 25 is a partially enlarged cross-sectional view of a semiconductor device according to an eighth embodiment of the present disclosure.

FIG. 25 is a partially enlarged cross-sectional view of a semiconductor device A8 according to an eighth embodiment of the present disclosure, which corresponds to FIG. 13. The semiconductor device A8 according to the present embodiment differs from the semiconductor device A1 according to the first embodiment in the position of the buffer member 81.

In the semiconductor device A8 according to the eighth embodiment, the buffer member 81 is interposed between the conductive member 22A and the semiconductor element 10A. The buffer member 81 and the conductive member 22A are bonded by solid phase diffusion bonding between the plated layer 85 (including Ag) formed on the obverse surface 801 of the buffer member 81 and the plated layer 222 (including Ag) formed on the obverse surface 221A of the conductive member 22A. The buffer member 81 and the semiconductor element 10 are bonded with the element bonding layer 31A. Some of the buffer members 81 transform during the pressurization and heating process, resulting in a shape having a bulge with an outer line curvilinear due to the press-fit as viewed in the z direction. The buffer member 82 may similarly be interposed between the conductive member 22B and the semiconductor element 10B. The buffer member 81 may be interposed between the element bonding layer 31A and the semiconductor element 10A, or the buffer member 82 may be interposed between the element bonding layer 31B and the semiconductor element 10B.

According to the present embodiment, the buffer member 81 is interposed between the conductive member 22A and the semiconductor element 10A. Some of the buffer members 81 are pressed and thinned by the pressure when the pressing member 90 presses each lead member 51 during the pressurization and heating process, and the position in the z direction of an upper surface of each lead member 51 (the distance between the obverse surface 221A of the conductive member 22A and the upper surface of each lead member 51) is about the same level. This equalizes the load applied on each semiconductor element 10A, thereby eliminating the uneven load applied on some of the semiconductor elements 10A. The semiconductor device A8 has a configuration in common with the semiconductor device A1, thereby achieving the same effect as the semiconductor device A1.

Figure 26:
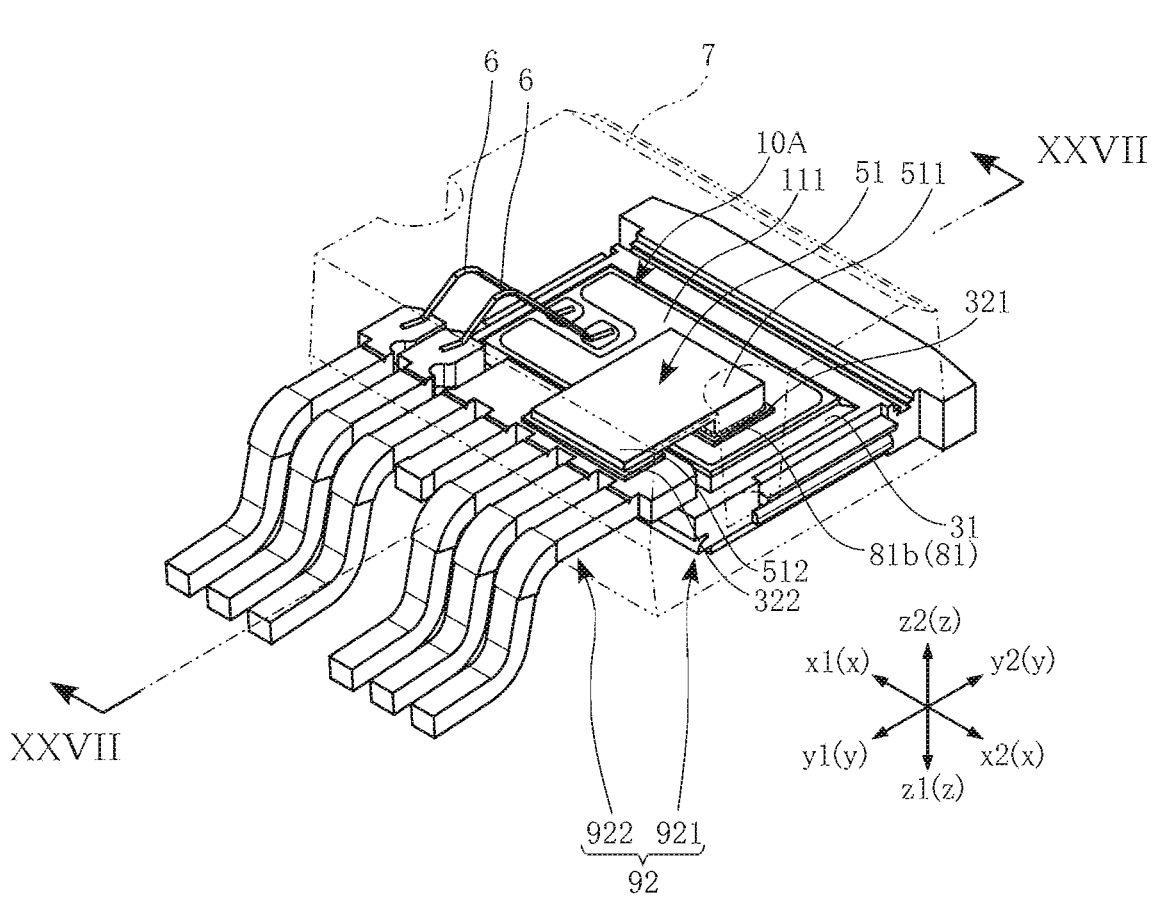
FIG. 26 is a perspective view of a semiconductor device according to a ninth embodiment of the present disclosure.
Figure 27:
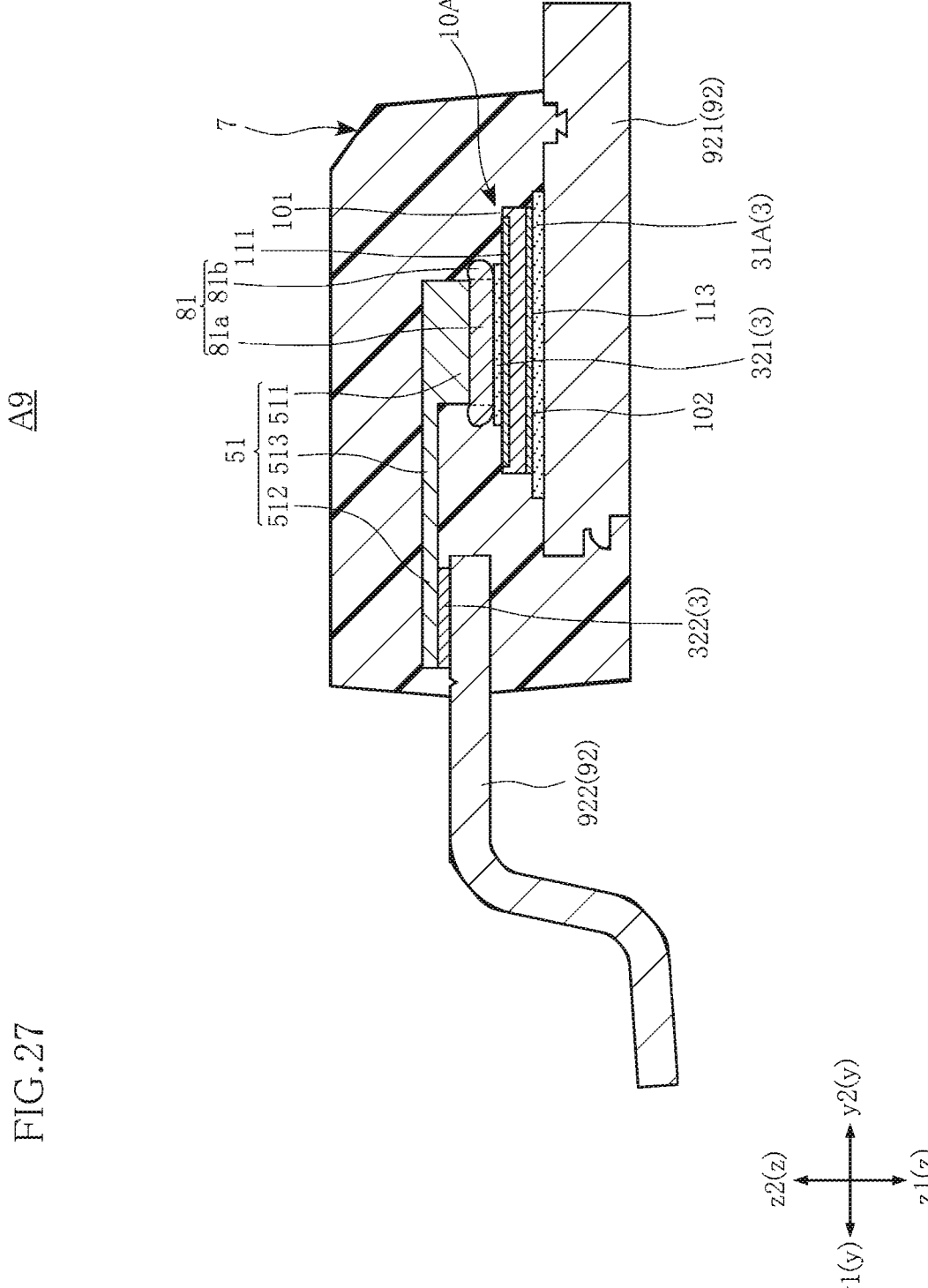
FIG. 27 is a cross-sectional view of FIG. 26 taken along a line XXVII-XXVII.
Figure 28A:
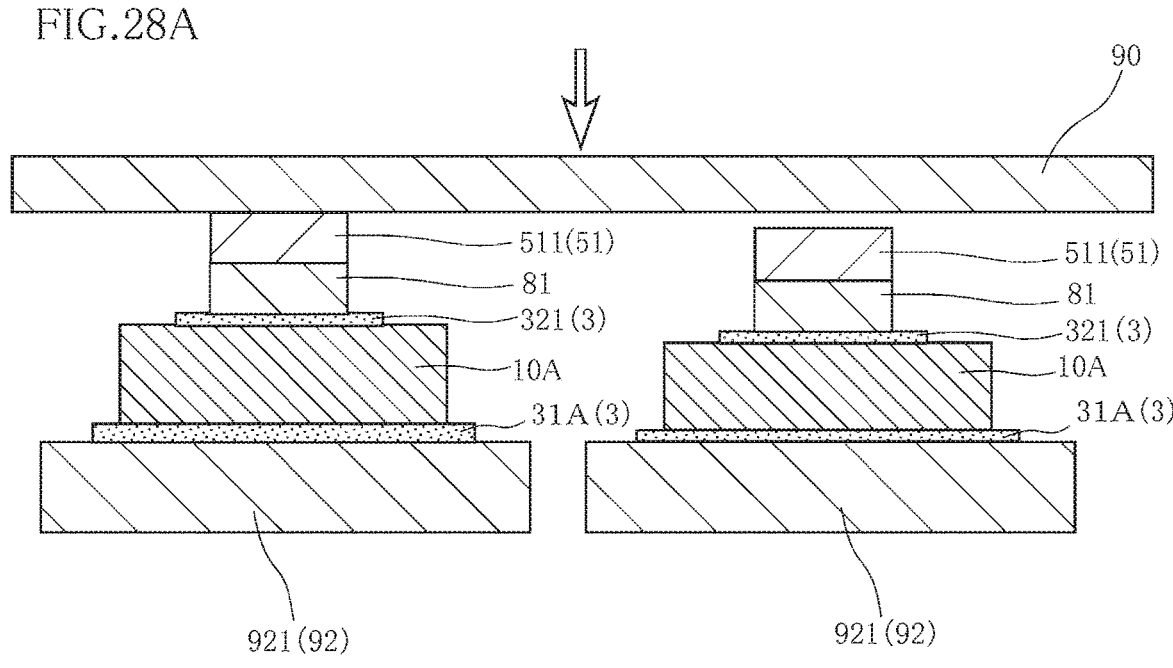
FIG. 28A is a schematic view for explaining a pressure heating step of the method for manufacturing a semiconductor device of FIG. 26, which shows the state before each buffer member transforms.
Figure 28B:
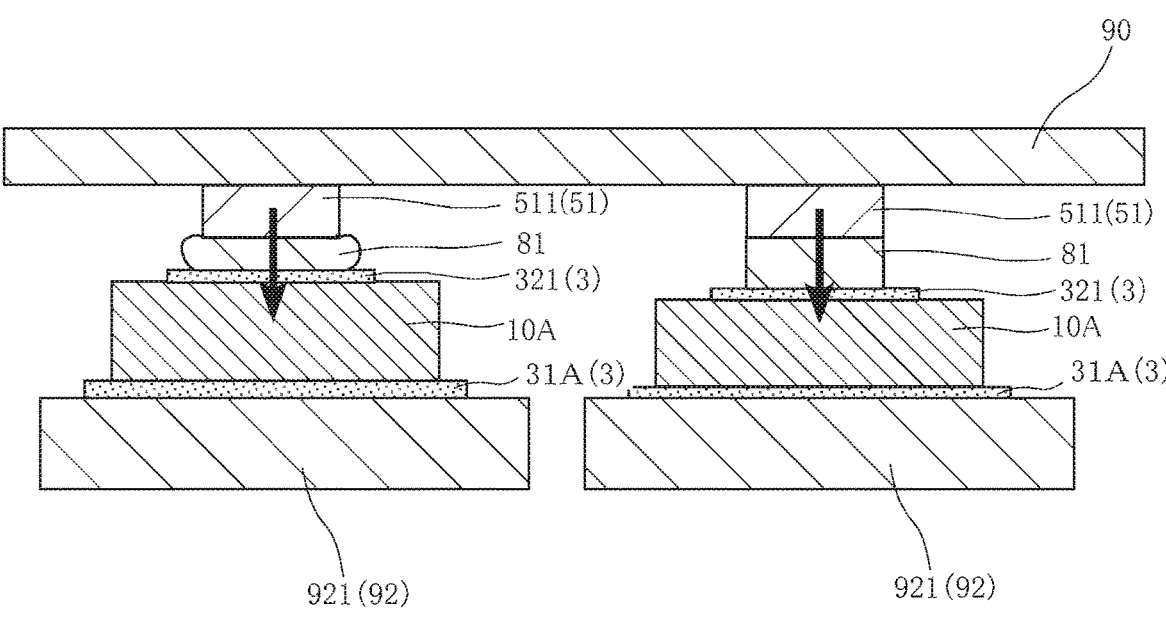
FIG. 28B is a schematic view for explaining a pressure heating step of the method for manufacturing a semiconductor device of FIG. 26, which shows the state after one of the buffer members transforms.
Figure 28B:
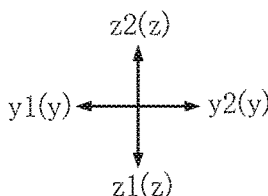

FIGS. 26 to 28B shows a semiconductor device A9 according to a ninth embodiment of the present disclosure. FIG. 26 is a perspective view of the semiconductor device A9, in which the sealing resin 7 is indicated by imaginary lines (dash-double dot lines). FIG. 27 is a cross-sectional view of FIG. 26 taken along a line XXVII-XXVII. Note that each plated layer is omitted in FIG. 27. FIGS. 28A and 28B are schematic views for explaining a pressure heating step of the method for manufacturing the semiconductor device A9. The semiconductor device A9 according to the present embodiment differs from the semiconductor device A1 according to the first embodiment in that there is only one semiconductor element 10A.

The semiconductor device A9 according to the ninth embodiment is a so-called lead-frame structure and includes a lead frame 92, as shown in FIG. 26. The constituent material of the lead frame 92 is not limited, but is, for example, Cu or a Cu alloy. The lead frame 92 has a die pad portion 921 and a terminal portion 922. The die pad portion 921 is a portion on which semiconductor element 10A is mounted. In the present embodiment, one semiconductor element 10A is mounted on the die pad portion 921 and the semiconductor element 10A is bonded with the element bonding layer 31. The die pad portion 921 is electrically connected to the drain electrode 113 of the semiconductor element 10A. In the present embodiment, the die pad portion 921 represents one example of a "conductor". The terminal portion 922 is partially exposed from the sealing resin 7. The terminal portion 922 is electrically connected to the source electrode 111 of the semiconductor element 10A via the lead members 51.

The first bonding portion 511 of the lead member 51 according to the ninth embodiment is electrically connected to the source electrode 111 of the semiconductor element 10A via the buffer member 81 and the lead bonding layer 321. The second bonding portion 512 is bonded to the terminal portion 922 with the lead bonding layer 322.

The buffer member 81 is interposed between the source electrode 111 of the semiconductor element 10A and the first bonding portion 511 of the lead member 51. In the pressurization and heating process of manufacturing the semiconductor device A9 process, a plurality of semiconductor devices A9 are, as shown in FIGS. 28A and 28B, processed for pressurizing and heating at once.

FIG. 28A shows two lead frames 92, the semiconductor elements that are mounted on each lead frame 92 respectively, the lead members 51 that are conductively connected to each semiconductor element 10A, the buffer members 81 that are, respectively, disposed between the semiconductor elements 10A and the lead members 51. The distance between the bottom of the left lead frame 92 and the upper surface of the left lead member 51 is greater than the right one. FIG. 28B shows the pressing state that the pressing member 90 presses the lead members 51. The buffer member 81 above the left semiconductor element 10A is transformed into a press-fit shape by the pressure. Thus, the thickness of the left buffer member 81 is reduced, and the distance between the bottom of the lead frame 92 and the upper surface of each lead member 51 is generally same level on the left one and the right one. This generally equalizes the load on the left semiconductor element 10A and the load on the right semiconductor element 10A, which the two semi-conductor elements are equally loaded.

In the plurality of semiconductor devices A9, which are manufactured at once, some of the buffer members 81 transform during the pressurization and heating process, and the load on each semiconductor element 10A is equalized. The semiconductor device A9 shown in FIGS. 26 and 27 is one that the buffer member 81 transform during the pres-surization and heating process. The buffer member 81 has a bulge with an outer line curvilinear due to the press-fit as viewed in the z direction. The cross-section has an out-wardly protruding shape with both ends arcuate in the directions orthogonal to the z direction. In FIG. 26, the second portion 81b is hatched. In FIG. 27, the boundary between the first portion 81a and the second portion 81b is indicated by a broken line. Note that some of the semicon-ductor devices A9 have the buffer member 81 that does not transform and remains the rectangular shape.

According to the present embodiment, the buffer member 81 is interposed between the first bonding portion 511 of the lead member 51 and the source electrode 111 of the semi-conductor element 10A. This eliminates the uneven load applied on the semiconductor element 10A during the pres-surization and heating process when manufacturing the plurality of semiconductor devices A9 at once. The semi-conductor device A9 has a configuration in common with the semiconductor device A1, thereby achieving the same effect as the semiconductor device A1. The present embodiment describes the case that the semiconductor device A9 includes the semiconductor elements 10A, but is not limited thereto. The semiconductor device A9 may include other semicon-ductor element such as a diode or an IC instead of the semiconductor element 10A.

The semiconductor devices according to the present dis-closure are not limited to the embodiments described above. The specific configuration of each part of a semiconductor device according to the present disclosure may suitably be designed and changed in various manners. The present disclosure includes the embodiments described in the fol-lowing clauses.

Clause 1. A semiconductor device comprising:
 a first semiconductor element having a first element obverse surface and a first element reverse surface that face opposite each other in a thickness direction, the first element obverse surface being provided with a first electrode;
 a first connecting member electrically connected to the first electrode; and
 a first member overlapping with the first electrode as viewed in the thickness direction, having a Vickers hardness lower than a Vickers hardness of the first connecting member, and having electrical conductivity.

Clause 2. The semiconductor device according to clause 1, wherein the first member has a bulge with an outer line curvilinear as viewed in the thickness direction.

Clause 3. The semiconductor device according to clause 1 or 2, wherein the Vickers hardness of the first member is lower than a Vickers hardness of Cu.

Clause 4. The semiconductor device according to clause 3, wherein the Vickers hardness of the first member is equal to or less than 50 HV and equal to or greater than 1 HV.

Clause 5. The semiconductor device according to clause 4, wherein the first member contains Al.

Clause 6. The semiconductor device according to any of clauses 1 to 5, wherein the first member is interposed between the first electrode and the first connecting member.

Clause 7. The semiconductor device according to clause 6, further comprising a conductive bonding layer interposed between the first member and the first electrode.

Clause 8. The semiconductor device according to clause 7, wherein the conductive bonding layer contains a sintered metal.

Clause 9. The semiconductor device according to clause 8, wherein the sintered metal comprises a sintered silver.

Clause 10. The semiconductor device according to any of clauses 6 to 9, further comprising a plated layer interposed between the first member and the first electrode and held in contact with the first member.

Clause 11. The semiconductor device according to any of clauses 6 to 10, wherein the first member comprises a first portion overlapping with the first connecting member as viewed in the thickness direction and a second portion connected to the first portion and protruding beyond the first connecting member as viewed in the thickness direction.

Clause 12. The semiconductor device according to any of clauses 6 to 11, further comprising a second semiconductor element having a second element obverse surface and a second element reverse surface that face opposite each other in the thickness direction, the second element obverse sur-face being provided with a second electrode; and a second member overlapping with the second electrode as viewed in the thickness direction, having a Vickers hardness lower than the Vickers hardness of the first connecting member, and having electrical conductivity.

Clause 13. The semiconductor device according to clause 12, further comprising a second connecting member elec-trically connected to the second electrode via the second member.

Clause 14. The semiconductor device according to clause 12, wherein the first connecting member is electrically connected to the second electrode via the second member.

Clause 15. The semiconductor device according to any of clauses 1 to 14, wherein a length of the first member in the thickness direction is equal to or greater than 10 percent of and equal to or less than 30 percent of a length of the first semiconductor element in the thickness direction.

Clause 16. A semiconductor device comprising:
 a first semiconductor element having a first element obverse surface and a first element reverse surface that face opposite each other in a thickness direction, the first element obverse surface being provided with a first electrode; and
 a first connecting member overlapping with the first electrode as viewed in the thickness direction and electrically connected to the first electrode;
 wherein the first connecting member has a Vickers hard-ness lower than a Vickers hardness of Cu and has electrical conductivity.

Clause 17. The semiconductor device according to any of clauses 1 to 16, further comprising a conductor on which the first semiconductor element is mounted; and a second conductive bonding layer interposed between the first semiconductor element and the conductor;

wherein the second conductive bonding layer contains a sintered silver.

Clause 18. The semiconductor device according to any of clauses 1 to 17, further comprising a wire bonded to the first connecting member.

Clause 19. The semiconductor device according to any of clauses 1 to 18, wherein the first semiconductor element comprises a power MOSFET.

REFERENCE SIGNS

A1 to A9: Semiconductor device
10A, 10B: Semiconductor element
101: Element obverse surface 102: Element reverse surface
111: Source electrode 112: Gate electrode
113: Drain electrode 115: Plated layer
13: Insulating film 20: Support substrate
21: Insulating substrate 211: Obverse surface
212: Reverse surface 22, 22A, 22B: Conductive member
221A, 221B: Obverse surface 222: Plated layer
23A, 23B: Insulating layer 24A, 24B: Gate layer
25B: Detection layer 29: Base portion
3: Conductive bonding layer
301, 302: Sintering metallic material
31, 31A, 31B: Element bonding layer
321, 322: Lead bonding layer
33: Terminal bonding layer 40: Terminal
41: Input terminal 411: Pad portion
411a: Comb teeth portion 412: Terminal portion
42: Input terminal 421: Pad portion
421a: Connecting portion 421b: Extending portion
421c: Protruding portion 421d: Plated layer
422: Terminal portion 43: Output terminal
431: Pad portion 431a: Comb teeth portion
432: Terminal portion 44A, 44B: Gate terminal
441: Pad portion 442: Terminal portion
45B: Detection terminal 451: Pad portion
452: Terminal portion 46: Dummy terminal
461: Pad portion 462: Terminal portion
47A, 47B: Side terminal 49: Insulating member
491: Interposing portion 492: Extending portion
51: Lead member 511: First bonding portion
512: Second bonding portion 513: Connection portion
515: Plated layer 55: Plate member
6: Wire 61: Gate wire
62: Detection wire 63: First connection wire
64: Second connection wire 65: Source wire
7: Sealing resin 71: Resin obverse surface
72: Resin reverse surface 731 to 734: Resin side surface
Recessed portion 8, 81, 82: Buffer member
801: Obverse surface 802: Reverse surface
81a, 82a: First portion 81b, 82b: Second portion
Plated layer 90: Pressing member
92: Lead flame 921: Die pad portion
922: Terminal portion

The invention claimed is:
1. A semiconductor device comprising:
a first semiconductor element having a first element obverse surface and a first element reverse surface that face opposite each other in a thickness direction, the first element obverse surface being provided with a first electrode;
a first connecting member electrically connected to the first electrode;
a first member overlapping with the first electrode as viewed in the thickness direction, having a Vickers hardness lower than a Vickers hardness of the first connecting member, and having electrical conductivity, the first member being interposed between the first electrode and the first connecting member; and
a conductive bonding layer interposed between the first member and the first electrode,
wherein the conductive bonding layer contains a sintered metal.

2. The semiconductor device according to claim 1, wherein the first member has a bulge with an outer line curvilinear as viewed in the thickness direction.

3. The semiconductor device according to claim 1, wherein the Vickers hardness of the first member is lower than a Vickers hardness of Cu.

4. The semiconductor device according to claim 3, wherein the Vickers hardness of the first member is equal to or less than 50 HV and equal to or greater than 1 HV.

5. The semiconductor device according to claim 4, wherein the first member contains Al.

6. The semiconductor device according to claim 1, wherein the sintered metal comprises a sintered silver.

7. The semiconductor device according to claim 1, further comprising a plated layer interposed between the first member and the first electrode and held in contact with the first member.

8. The semiconductor device according to claim 1, wherein the first member further comprises a first portion overlapping with the first connecting member as viewed in the thickness direction and a second portion connected to the first portion and protruding beyond the first connecting member as viewed in the thickness direction.

9. The semiconductor device according to claim 1, further comprising a second semiconductor element having a second element obverse surface and a second element reverse surface that face opposite each other in the thickness direction, the second element obverse surface being provided with a second electrode; and
a second member overlapping with the second electrode as viewed in the thickness direction, having a Vickers hardness lower than the Vickers hardness of the first connecting member, and having electrical conductivity.

10. The semiconductor device according to claim 9, further comprising a second connecting member electrically connected to the second electrode via the second member.

11. The semiconductor device according to claim 9, wherein the first connecting member is electrically connected to the second electrode via the second member.

12. The semiconductor device according to claim 1, wherein a length of the first member in the thickness direction is equal to or greater than 10 percent of and equal to or less than 30 percent of a length of the first semiconductor element in the thickness direction.

13. The semiconductor device according to claim 1, further comprising a conductor on which the first semiconductor element is mounted; and
a second conductive bonding layer interposed between the first semiconductor element and the conductor;
wherein the second conductive bonding layer contains a sintered silver.

14. The semiconductor device according to claim 1, further comprising a wire bonded to the first connecting member.

15. The semiconductor device according to claim 1, wherein the first semiconductor element comprises a power MOSFET.

* * * * *